US012812915B2

(12) United States Patent
Yeon et al.

(10) Patent No.: US 12,812,915 B2
(45) Date of Patent: Nov. 24, 2026

(54) THIN FILM TRANSISTOR AND DISPLAY DEVICE INCLUDING THE SAME

(71) Applicant: LG Display Co., Ltd., Seoul (KR)

(72) Inventors: DeukHo Yeon, Seoul (KR); SunWook Ko, Seoul (KR); KiTae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 368 days.

(21) Appl. No.: 18/514,318

(22) Filed: Nov. 20, 2023

(65) Prior Publication Data

US 2024/0222463 A1 Jul. 4, 2024

(30) Foreign Application Priority Data

Dec. 30, 2022 (KR) ........................ 10-2022-0190460

(51) Int. Cl.
*H01L 29/66* (2006.01)
*H10D 30/67* (2025.01)
*H10K 59/124* (2023.01)

(52) U.S. Cl.
CPC ..... *H10D 30/6739* (2025.01); *H10D 30/6734* (2025.01); *H10K 59/124* (2023.02); *H10D 30/6755* (2025.01)

(58) Field of Classification Search
CPC ............. H10D 86/481; H10D 30/6728; H10D 86/425; H10D 86/427; H10D 86/431; H10D 86/471; H10D 30/6739; H10D 30/6734; H10D 30/6755; H10D 30/673; H10D 30/6757; H10D 86/423; H10D 86/60; H10D 30/6758; H10K 59/124; H10K 59/1213
See application file for complete search history.

(56) References Cited

U.S. PATENT DOCUMENTS 8,945,981 B2 2/2015 Yamazaki et al.
9,024,323 B2 5/2015 Oh et al.
10,326,025 B2 6/2019 Yamazaki et al.
(Continued)

FOREIGN PATENT DOCUMENTS

KR 10-2003-0048131 A 6/2003
KR 10-2009-0122643 A 12/2009
(Continued)

OTHER PUBLICATIONS

Thin Film Transistor Display Board and Its Manufacturing Method (Year: 2007).*

*Primary Examiner* — Leonard Chang
*Assistant Examiner* — Tsz K Chiu
(74) *Attorney, Agent, or Firm* — Fenwick & West LLP

(57) ABSTRACT

Disclosed is a thin film transistor and a display device including the same. The thin film transistor includes a first buffer layer; a lower gate electrode on the first buffer layer; a second buffer layer on the lower gate electrode; an active layer on the second buffer layer and including a source region, a drain region, and a channel region between the source region and the drain region; a gate insulating layer on the active layer; and an upper gate electrode on the gate insulating layer. At least one of the upper gate electrode and the lower gate electrode includes a plurality of layers, and a work function of a layer adjacent to the active layer is greater than a work function of a layer far from the active layer, among the plurality of layers.

12 Claims, 10 Drawing Sheets

(56) References Cited

U.S. PATENT DOCUMENTS

| | | | | |
|---|---|---|---|---|
| 2006/0110871 | A1* | 5/2006 | Gan | H10D 30/6739 257/E21.414 |
| 2010/0025677 | A1 | 2/2010 | Yamazaki et al. | |
| 2012/0153275 | A1 | 6/2012 | Endo et al. | |
| 2013/0256668 | A1 | 10/2013 | Oh et al. | |
| 2015/0091009 | A1 | 4/2015 | Yamazaki et al. | |
| 2020/0091264 | A1 | 3/2020 | Lee et al. | |
| 2020/0144345 | A1* | 5/2020 | Cha | H10K 59/131 |
| 2021/0143239 | A1* | 5/2021 | Kim | H10D 86/451 |
| 2022/0208911 | A1 | 6/2022 | Cho et al. | |

FOREIGN PATENT DOCUMENTS

| | | | |
|---|---|---|---|
| KR | 10-2012-0068738 | A | 6/2012 |
| KR | 10-2013-0110490 | A | 10/2013 |
| KR | 10-2018-0031662 | A | 3/2018 |
| KR | 10-2020-0032594 | A | 3/2020 |
| KR | 10-2021-0055832 | A | 5/2021 |
| KR | 10-2022-0096489 | A | 7/2022 |

* cited by examiner

THIN FILM TRANSISTOR AND DISPLAY DEVICE INCLUDING THE SAME

CROSS-REFERENCE TO RELATED APPLICATION

This application claims the priority benefit of Republic of Korea Patent Application No. 10-2022-0190460 filed on Dec. 30, 2022, in the Republic of Korea, which is hereby incorporated by reference in its entirety.

BACKGROUND

Technical Field

The present disclosure relates to a thin film transistor, and more particularly, for example, without limitation, to a thin film transistor having a reduced channel length of an active layer and a display device including the same.

Discussion of the Related Art

An organic light emitting diode (OLED), which is a self-luminous element, includes an anode electrode and a cathode electrode, and an organic compound layer formed therebetween. The organic compound layer includes a hole transport layer (HTL), an emission layer (EML), and an electron transport layer (ETL), etc. When a voltage is applied to the anode electrode and the cathode electrode, holes that have passed through the hole transport layer and electrons that have passed through the electron transport layer are moved to the emission layer to form excitons, and thus, light is generated from the emission layer. An organic light emitting display device includes an organic light emitting diode (OLED) which is a self-luminous element, and is widely used due to advantages of a fast response speed, high emission efficiency and luminance, and a wide viewing angle.

The organic light emitting display device includes pixels arranged in a matrix form, and each of the pixels includes an organic light emitting diode. The luminance of the pixels can be adjusted according to a gray level of video data. Each of the pixels may include an organic light emitting diode, a driving transistor for controlling a driving current flowing through the organic light emitting diode according to a gate-source voltage, and at least one switch transistor for programming the gate-source voltage of the driving transistor.

SUMMARY

The inventors have recognized requirements on reliability of light emitting element. Accordingly, an object to be achieved by the present disclosure is to provide a thin film transistor having improved (or secured) reliability and a display device including the same.

Another object to be achieved by the present disclosure is to provide a thin film transistor having a reduced (or minimized) channel length of an active layer and a display device including the same.

Objects of the present disclosure are not limited to the above-mentioned objects, and other objects, which are not mentioned above, can be clearly understood by those skilled in the art from the following descriptions.

According to an aspect of the present disclosure, a thin film transistor may include a first buffer layer; a lower gate electrode on the first buffer layer; a second buffer layer on the lower gate electrode; an active layer on the second buffer layer and including a source region, a drain region, and a channel region between the source region and the drain region; a gate insulating layer on the active layer; an upper gate electrode on the gate insulating layer; an interlayer insulating layer on the upper gate electrode; and a source electrode and a drain electrode on the interlayer insulating layer and in contact with the source region and the drain region respectively through through-holes penetrating the interlayer insulating layer and the gate insulating layer. At least one of the upper gate electrode and the lower gate electrode may include a plurality of layers, and a work function of a layer adjacent to the active layer may be greater than a work function of a layer far from the active layer, among the plurality of layers.

According to another aspect of the present disclosure, a display device may include a substrate; and pixels including at least one thin film transistor on the substrate. The at least one thin film transistor may include a first buffer layer; a lower gate electrode on the first buffer layer; a second buffer layer on the lower gate electrode; an active layer on the second buffer layer and including a source region, a drain region, and a channel region between the source region and the drain region; a gate insulating layer on the active layer; an upper gate electrode on the gate insulating layer; an interlayer insulating layer on the upper gate electrode; and a source electrode and a drain electrode on the interlayer insulating layer and in contact with the source region and the drain region respectively through through-holes penetrating the interlayer insulating layer and the gate insulating layer. At least one of the upper gate electrode and the lower gate electrode may include a plurality of layers, and a work function of a layer adjacent to the active layer may be greater than a work function of a layer far from the active layer, among the plurality of layers.

Other detailed matters of the exemplary embodiments are included in the detailed description and the drawings.

In the thin film transistor and the display device including the thin film transistor according to exemplary embodiments of the present disclosure, an upper gate electrode and/or a lower gate electrode included in the thin film transistor may include a plurality of layers having different work function values. Here, among the plurality of layers included in the upper gate electrode and/or the lower gate electrode of the thin film transistor, a layer (or sub-gate electrode) adjacent to an active layer may include a metal oxide having a relatively high work function. Accordingly, a depletion layer can be more easily formed in a channel region portion of the active layer, and thus, a threshold voltage of the thin film transistor can be shifted in a positive direction. Therefore, in the case of the thin film transistor and the display device including the thin film transistor according to exemplary embodiments of the present disclosure, a defect in which a margin of an effective channel length of the active layer is reduced or element reliability is degraded, is not caused and it is possible to positively shift and set an initial threshold voltage to a predetermined level. Accordingly, element reliability of the thin film transistor can be improved (or secured).

In addition, in the thin film transistor and the display device including the thin film transistor according to exemplary embodiments of the present disclosure, according to a difference in etching rate of the plurality of layers included in the upper gate electrode of the thin film transistor, a lower layer (or sub-gate electrode) among the plurality of layers has a relatively small width in an etching process. Thus, when a doping process is performed for conductorization of a source region and a drain region of the active layer, a channel region having a relatively small length can be formed. Accordingly, a channel length of the active layer included in the thin film transistor can be minimized to achieve process optimization.

It is to be understood that both the foregoing general description and the following detailed description are exemplary and explanatory and are intended to provide further explanation of the inventive concepts as claimed. The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. The above and other objects, features and other advantages of the present disclosure will be more clearly understood from the following detailed description taken in conjunction with the accompanying drawings, in which.

Figure 1:
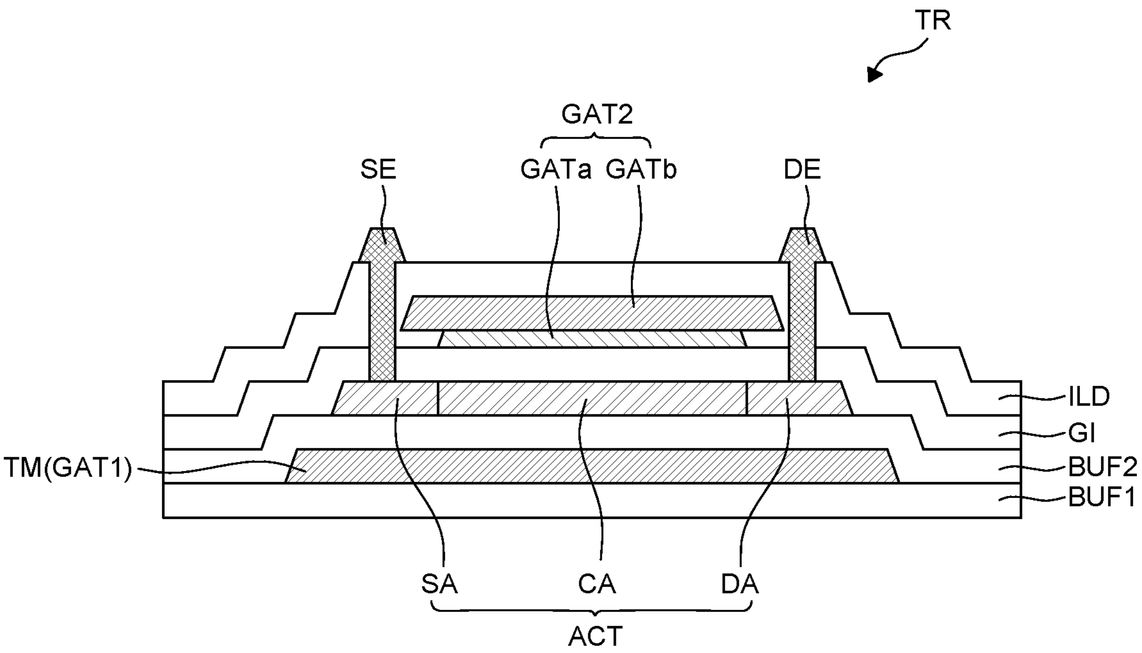
FIG. 1 is a cross-sectional view illustrating a thin film transistor according to exemplary embodiments of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. The terms such as "include," "have," "comprise," "contain," "constitute," "make up of," and "formed of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "over", "below", "under", "beside", "beneath", "near", "close to," "adjacent to", "on a side of", "next" or the like, one or more parts may be positioned between the two parts unless the terms are used with the term "immediately" or "directly".

Spatially relative terms, such as "under," "below," "beneath", "lower," "over," "upper" and the like, may be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

In describing temporal relationship, terms such as "after," "subsequent to," "following," "next," "before," and the like may include cases where any two events are not consecutive, unless the term such as "immediately" "just" or "directly" is explicitly used.

When an element or layer is disposed "on" another element or layer, another layer or another element may be interposed directly on the other element or therebetween.

And, when it is described using the terms such as 'contact' or 'connect', it may include 'contact' or 'connect' through one or more other components located between two components unless the terms are used with the term 'immediately' or 'directly'.

Although the terms "first", "second", "A", "B", "(a)", "(b)" and the like are used for describing various components, these components are not confined by these terms. These terms are merely used for distinguishing one component from the other components. Therefore, a first component to be mentioned below may be a second component in a technical concept of the present disclosure.

In addition, terms, such as first, second, A, B, (a), (b), or the like may be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer may be "connected", "coupled", "adhered" or "joined" to the structural element or layer directly or indirectly.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

A term "device" used herein may refer to a display device including a display panel and a driver for driving the display panel. Examples of the display device may include a light emitting diode LED, and the like. In addition, examples of the device may include a notebook computer, a television, a computer monitor, an automotive device, a wearable device, and an automotive equipment device, and a set electronic device (or apparatus) or a set device (or apparatus), for example, a mobile electronic device such as a smartphone or an electronic pad, which are complete products or final products respectively including LED and the like, but embodiments of the present disclosure are not limited thereto.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

Hereinafter, the present disclosure will be described in detail with reference to accompanying drawings.

FIG. 1 is a cross-sectional view illustrating a thin film transistor according to exemplary embodiments of the present disclosure. All the components of each display device according to all embodiments of the present disclosure are operatively coupled and configured.

Referring to FIG. 1, a thin film transistor TR according to exemplary embodiments of the present disclosure may include a plurality of buffer layers BUF1 and BUF2, a plurality of insulating layers GI and ILD, an active layer ACT, a lower gate electrode GAT1 (or a light blocking layer TM), an upper gate electrode GAT2, a source electrode SE, and a drain electrode DE.

The first buffer layer BUF1 may be disposed (or provided or formed) on an upper surface of a substrate (e.g., a lower substrate, a base substrate or the like) on which the thin film transistor TR is formed. The first buffer layer BUF1 may block materials that may permeate from the outside, such as moisture.

The first buffer layer BUF1 may include silicon oxide, silicon nitride, or silicon oxynitride. Depending on embodiments, the first buffer layer BUF1 may be formed by using a silicon oxide layer, a silicon nitride layer, or a silicon oxynitride layer alone. Alternatively, the first buffer layer BUF1 may have a stacked structure including a silicon oxide layer, a silicon nitride layer, or a silicon oxynitride layer. For example, the first buffer layer BUF1 may be formed of an inorganic insulating film, and the inorganic insulating film may be provided as a single film or multiple films, respectively. For example, the inorganic insulating film in a single layer may be a silicon oxide (SiOx) film, a silicon nitride (SiNx) film or a silicon oxynitride (SiON) film, and inorganic insulating films in multiple layers may formed by alternately stacking two or more among one or more silicon oxide (SiOx) films, one or more silicon nitride (SiNx) films, and one or more silicon oxynitride (SiON) films, and one or more amorphous silicon (a-Si), but the present disclosure is not limited thereto.

The lower gate electrode GAT1 (or the light blocking layer TM) may be provided (or disposed) on the first buffer layer BUF1. The lower gate electrode GAT1 may be disposed to overlap at least a portion of the active layer ACT (e.g., a channel region CA of the active layer ACT).

The lower gate electrode GAT1 may include a metal. For example, the lower gate electrode GAT1 may include a metal material such as molybdenum (Mo) or titanium (Ti). Depending on embodiments, the lower gate electrode GAT1 may be a single layer or a multilayer formed of any one of metal materials such as molybdenum (Mo) and titanium (Ti) or an alloy thereof. However, this is exemplary, and the metal material included in the lower gate electrode GAT1 is not limited thereto.

The second buffer layer BUF2 may be provided (or disposed) on the lower gate electrode GAT1. For example, the second buffer layer BUF2 may be provided on the first buffer layer BUF1 to cover the lower gate electrode GAT1.

The second buffer layer BUF2 may include silicon oxide, silicon nitride, or silicon oxynitride. Depending on embodiments, the second buffer layer BUF2 may be formed by using a silicon oxide layer, a silicon nitride layer, or a silicon oxynitride layer alone. Alternatively, the second buffer layer BUF2 may have a stacked structure including a silicon oxide layer, a silicon nitride layer, or a silicon oxynitride layer. For example, the second buffer layer BUF2 may be formed of an inorganic insulating film, and the inorganic insulating film may be provided as a single film or multiple films, respectively. For example, the inorganic insulating film in a single layer may be a silicon oxide (SiOx) film, a silicon nitride (SiNx) film or a silicon oxynitride (SiON) film, and inorganic insulating films in multiple layers may formed by alternately stacking two or more among one or more silicon oxide (SiOx) films, one or more silicon nitride (SiNx) films, and one or more silicon oxynitride (SiON) films, and one or more amorphous silicon (a-Si), but the present disclosure is not limited thereto.

The active layer ACT may be provided (or disposed) on the second buffer layer BUF2.

In an exemplary embodiment, the active layer ACT may include an oxide semiconductor layer. For example, the active layer ACT may include an intrinsic channel region CA that includes an oxide semiconductor and is not doped with impurities, and a source region SA and a drain region DA that are conductive by being doped with impurities. The source region SA may be disposed to correspond to a first end of the active layer ACT, and the drain region DA may be disposed to correspond to a second end of the active layer ACT. The channel region CA may be disposed between the source region SA and the drain region DA.

The source electrode SE and the drain electrode DE are electrically connected to the source region SA and the drain region DA of the active layer ACT, respectively, and thus, a channel through which charges move (that is, the channel region CA) can be formed.

The active layer ACT may be disposed to overlap at least a portion of each of the lower gate electrode GAT1 disposed therebelow and the upper gate electrode GAT2 disposed thereabove. That is, the thin film transistor TR according to exemplary embodiments of the present disclosure may include a dual-gate structure including the lower gate electrode GAT1 and the upper gate electrode GAT2. In this case, a flow of current flowing through the channel region CA can be more precisely controlled, and the thin film transistor TR can be formed with a reduced size. However, exemplary embodiments of the present disclosure are not limited thereto. For example, the thin film transistor TR may be formed to have a top-gate structure including only a gate electrode disposed above the active layer ACT, or may be formed to have a bottom-gate structure including only a gate electrode disposed below the active layer ACT.

A gate insulating layer GI may be provided (or disposed) on the active layer ACT. For example, the gate insulating layer GI may be provided on the second buffer layer BUF2 to cover the active layer ACT.

The gate insulating layer GI may include silicon oxide, silicon nitride, silicon oxynitride, or the like. Depending on embodiments, the gate insulating layer GI may be formed by using a silicon oxide layer, a silicon nitride layer, or a silicon oxynitride layer alone. Alternatively, the gate insulating layer GI may have a stacked structure including a silicon oxide layer, a silicon nitride layer, or a silicon oxynitride layer. For example, the gate insulating layer GI may be formed of an inorganic insulating film, and the inorganic insulating film may be provided as a single film or multiple films, respectively. For example, the inorganic insulating film in a single layer may be a silicon oxide (SiOx) film, a silicon nitride (SiNx) film or a silicon oxynitride (SiON) film, and inorganic insulating films in multiple layers may formed by alternately stacking two or more among one or more silicon oxide (SiOx) films, one or more silicon nitride (SiNx) films, and one or more silicon oxynitride (SiON) films, and one or more amorphous silicon (a-Si), but the present disclosure is not limited thereto.

The upper gate electrode GAT2 may be provided (or disposed) on the gate insulating layer GI. The upper gate electrode GAT2 may be disposed to overlap at least a portion of the active layer ACT (e.g., the channel region CA of the active layer ACT).

In an exemplary embodiment, the upper gate electrode GAT2 may have a stacked structure including a plurality of layers. For example, the upper gate electrode GAT2 may include a structure in which a metal oxide layer and a metal layer are stacked. For example, the upper gate electrode GAT2 may include a first sub-gate electrode GATa and a second sub-gate electrode GATb.

The first sub-gate electrode GATa may be provided (or disposed) on the gate insulating layer GI.

The first sub-gate electrode GATa may include a metal oxide. For example, the first sub-gate electrode GATa may include molybdenum oxide (MoOx). However, this is exemplary, and the first sub-gate electrode GATa may be formed of a metal oxide including another metal, for example, the first sub-gate electrode GATa may include titanium oxide (TiOx).

The second sub-gate electrode GATb may be provided (or disposed) on the first sub-gate electrode GATa.

The second sub-gate electrode GATb may include a metal. For example, the second sub-gate electrode GATb may include a metal material such as molybdenum (Mo) or titanium (Ti). Depending on embodiments, the second sub-gate electrode GATb may be a single layer or a multilayer formed of any one of metal materials such as molybdenum (Mo) and titanium (Ti) or an alloy thereof. However, this is exemplary, and the metal material included in the second sub-gate electrode GATb is not limited thereto.

In an exemplary embodiment, a work function of the first sub-gate electrode GATa and a work function of the second sub-gate electrode GATb may be different. For example, the work function of the first sub-gate electrode GATa may be greater than the work function of the second sub-gate electrode GATb. That is, among the plurality of layers included in the upper gate electrode GAT2, a layer adjacent to the active layer ACT (e.g., the first sub-gate electrode GATa) may have a relatively large work function.

For example, as in the above example, the work function of the first sub-gate electrode GATa including a metal oxide may be greater than the work function of the second sub-gate electrode GATb including a metal. For example, when the first sub-gate electrode GATa includes molybdenum oxide (MoOx) and the second sub-gate electrode GATb includes a metal material such as molybdenum (Mo) or titanium (Ti), the work function of the first sub-gate electrode GATa may be about 6.5 eV, and the work function of the second sub-gate electrode GATb may be about 4.3 eV.

Meanwhile, as described above, when the thin film transistor TR according to exemplary embodiments of the present disclosure is an oxide thin film transistor, the active layer ACT may include an oxide semiconductor. In this manner, in the case of the oxide thin film transistor, it is necessary to positively shift and set an initial threshold voltage to a predetermined level in order to secure mobility for element reliability and secure a margin of the threshold voltage. In this manner, in order to positively shift the initial threshold voltage to a predetermined level, a method such as a method of injecting excess oxygen into the gate insulating layer GI may be used. However, in the case of using this method, there may occur a defect in which reliability of the oxide thin film transistor is degraded due to the injected excess oxygen. In addition, when the above method is used, there may occur a defect in which a margin of an effective channel length of the active layer is reduced.

The upper gate electrode GAT2 included in the thin film transistor TR according to exemplary embodiments of the present disclosure may include a plurality of layers having different work function values. That is, as described above, the upper gate electrode GAT2 may include the first sub-gate electrode GATa having a relatively high work function and the second sub-gate electrode GATb having a relatively low work function. In this manner, when the upper gate electrode GAT2 includes the first sub-gate electrode GATa having a relatively large work function (in particular, when the first sub-gate electrode GATa adjacent to the active layer ACT has a relatively large work function), a depletion layer may be more easily formed in a portion of the channel region CA of the active layer ACT, and the depletion layer may allow the threshold voltage of the thin film transistor TR to be shifted in a positive direction. In this manner, the thin film transistor TR according to exemplary embodiments of the present disclosure includes a gate electrode (for example, the upper gate electrode GAT2) including a metal oxide layer (for example, the first sub-gate electrode GATa) having a relatively high work function value, without using a method such as a method of injecting excess oxygen into the gate insulating layer GI. Thus, a defect in which the margin of the effective channel length of the active layer ACT is reduced or element reliability is degraded is not caused, and it is possible to positively shift and set an initial threshold voltage to a predetermined level. Accordingly, element reliability of the thin film transistor TR can be improved (or secured).

In an exemplary embodiment, referring to FIG. 1 again, a width of the first sub-gate electrode GATa and a width of the second sub-gate electrode GATb may be different. For example, the width of the second sub-gate electrode GATb may be greater than that of the first sub-gate electrode GATa.

For example, in a manufacturing process of the thin film transistor TR, when performing an etching process to form the upper gate electrode GAT2 including the first sub-gate electrode GATa and the second sub-gate electrode GATb after depositing a metal oxide layer (e.g., molybdenum oxide (MoOx)) on an entire surface of the gate insulating layer GI, and depositing a metal layer (e.g., a metal layer including a metal material such as molybdenum (Mo) or titanium (Ti)), the width of the first sub-gate electrode GATa may be formed to be smaller than that of the second sub-gate electrode GATb according to a difference in etching rate between the metal oxide layer and the metal layer. Accordingly, in a subsequent doping process for conductorization of the source region SA and the drain region DA of the active layer ACT, a length of the intrinsic channel region CA, which is not doped with impurities of the active layer ACT may be reduced by the second sub-gate electrode GATb having a relatively small width. Accordingly, the channel length of the active layer ACT included in the thin film transistor TR may be reduced (or minimized). A detailed description thereof will be provided in more detail with reference to FIGS. 5A and 5B.

Referring back to FIG. 1, an interlayer insulating layer ILD may be provided (or disposed) on the upper gate electrode GAT2. For example, the interlayer insulating layer ILD may be provided on the gate insulating layer GI to cover the upper gate electrode GAT2.

The interlayer insulating layer ILD may include silicon oxide, silicon nitride, silicon oxynitride, or the like. Depending on embodiments, the interlayer insulating layer ILD may be formed by using a silicon oxide layer, a silicon nitride layer, or a silicon oxynitride layer alone. Alternatively, the interlayer insulating layer ILD may have a stacked structure including a silicon oxide layer, a silicon nitride layer, or a silicon oxynitride layer. For example, the interlayer insulating layer ILD may be formed of an inorganic insulating film, and the inorganic insulating film may be provided as a single film or multiple films, respectively. For example, the inorganic insulating film in a single layer may be a silicon oxide (SiOx) film, a silicon nitride (SiNx) film or a silicon oxynitride (SiON) film, and inorganic insulating films in multiple layers may formed by alternately stacking two or more among one or more silicon oxide (SiOx) films, one or more silicon nitride (SiNx) films, and one or more silicon oxynitride (SiON) films, and one or more amorphous silicon (a-Si), but the present disclosure is not limited thereto.

The source electrode SE and the drain electrode DE may be provided (or disposed) on the interlayer insulating layer ILD. The source electrode SE and the drain electrode DE may come into contact with the source region SA and the drain region DA of the active layer ACT, respectively, through through-holes penetrating the interlayer insulating layer ILD and the gate insulating layer GI.

In an exemplary embodiment, the source electrode SE and the drain electrode DE may be single layers or multilayers formed of any one of molybdenum (Mo), aluminum (Al), chromium (Cr), gold (Au), titanium (Ti), nickel (Ni), neodymium (Nd) and copper (Cu) or alloys of them, but the present disclosure is not limited thereto.

Figure 2:
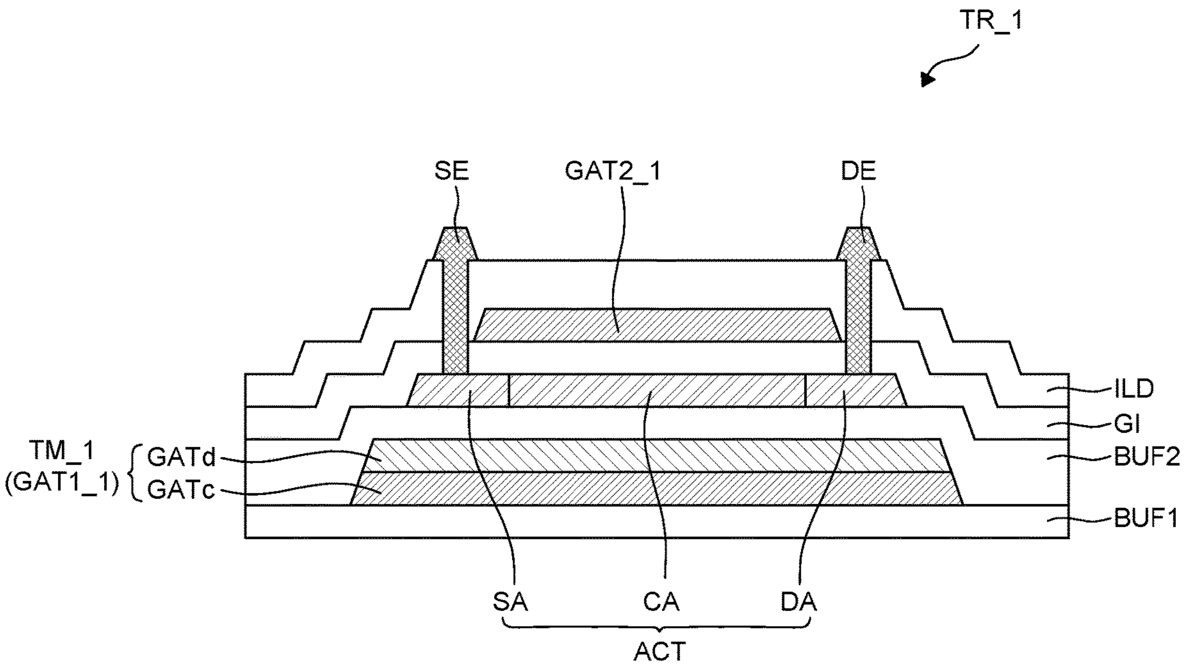
FIG. 2 is a cross-sectional view illustrating a thin film transistor according to exemplary embodiments of the present disclosure.

FIG. 2 is a cross-sectional view illustrating a thin film transistor according to exemplary embodiments of the present disclosure.

Meanwhile, in FIG. 2, a thin film transistor TR_1 of FIG. 2 represents a modified embodiment of the thin film transistor TR described with reference to FIG. 1 in relation to a structure of a gate electrode. For example, in the case of the thin film transistor TR_1 of FIG. 2, a lower gate electrode GAT1_1 which is a lower gate electrode may have a structure including a plurality of layers. Accordingly, to avoid descriptions overlapping with contents described in FIG. 1, differences with the embodiment of FIG. 1 will be mainly described, and parts not specifically described follow the embodiment of FIG. 1. In addition, the same reference numerals indicate the same components, and similar reference numerals indicate similar components.

Referring to FIG. 2, the thin film transistor TR_1 according to exemplary embodiments of the present disclosure includes the plurality of buffer layers BUF1 and BUF2, the plurality of insulating layers GI and ILD, the active layer ACT, the lower gate electrode GAT1_1 (or light blocking layer TM_1), an upper gate electrode GAT2_1, the source electrode SE, and the drain electrode DE.

The lower gate electrode GAT1_1 (or the light blocking layer TM_1) may be provided (or disposed) on the first buffer layer BUF1. The lower gate electrode GAT1_1 may be disposed to overlap at least a portion of the active layer ACT (e.g., the channel region CA of the active layer ACT).

In an exemplary embodiment, the lower gate electrode GAT1_1 may have a stacked structure including a plurality of layers. For example, the lower gate electrode GAT1_1 may include a structure in which a metal layer and a metal oxide layer are stacked. For example, the lower gate electrode GAT1_1 may include a third sub-gate electrode GATc and a fourth sub-gate electrode GATd.

The third sub-gate electrode GATc may be provided (or disposed) on the first buffer layer BUF1.

The third sub-gate electrode GATc may include a metal. For example, the third sub-gate electrode GATc may include a metal material such as molybdenum (Mo) or titanium (Ti). Depending on embodiments, the third sub-gate electrode GATc may be a single layer or a multilayer formed of any one of metal materials such as molybdenum (Mo) and titanium (Ti) or an alloy thereof. However, this is exemplary, and the metal material included in the third sub-gate electrode GATc is not limited thereto.

The fourth sub-gate electrode GATd may be provided (or disposed) on the third sub-gate electrode GATc.

The fourth sub-gate electrode GATd may include a metal oxide. For example, the fourth sub-gate electrode GATd may include molybdenum oxide (MoOx). However, this is exemplary, and the fourth sub-gate electrode GATd may be formed of a metal oxide including another metal, for example, the fourth sub-gate electrode GATd may include titanium oxide (TiOx).

In an exemplary embodiment, a work function of the third sub-gate electrode GATc and a work function of the fourth sub-gate electrode GATd may be different. For example, the work function of the fourth sub-gate electrode GATd may be greater than that of the third sub-gate electrode GATc. That is, among the plurality of layers included in the lower gate electrode GAT1_1, a layer adjacent to the active layer ACT (e.g., the fourth sub-gate electrode GATd) may have a relatively large work function.

For example, as in the above example, the work function of the fourth sub-gate electrode GATd including a metal oxide may be greater than the work function of the third sub-gate electrode GATc including a metal. For example, when the fourth sub-gate electrode GATd includes molybdenum oxide (MoOx) and the third sub-gate electrode GATc includes a metal material such as molybdenum (Mo) or titanium (Ti), the work function of the fourth sub-gate electrodes GATd may be about 6.5 eV, and the work function of the third sub-gate electrode GATc may be about 4.3 eV.

Accordingly, as described with reference to FIG. 2, the thin film transistor TR_1 according to exemplary embodiments of the present disclosure includes a gate electrode (for example, the lower gate electrode GAT1_1) including a metal oxide layer (for example, the fourth sub-gate electrode GATd) having a relatively high work function value, without using a method such as a method of injecting excess oxygen into the gate insulating layer GI. Thus, a defect in which the margin of the effective channel length of the active layer ACT is reduced or element reliability is degraded is not caused, and it is possible to positively shift and set an initial threshold voltage to a predetermined level. Accordingly, element reliability of the thin film transistor TR can be improved (or secured).

The upper gate electrode GAT2_1 may be provided (or disposed) on the gate insulating layer GI. The upper gate electrode GAT2_1 may be disposed to overlap at least a portion of the active layer ACT (e.g., the channel region CA of the active layer ACT).

The upper gate electrode GAT2_1 may include a metal. For example, the upper gate electrode GAT2_1 may include a metal material such as molybdenum (Mo) or titanium (Ti). Depending on embodiments, the upper gate electrode GAT2_1 may be a single layer or a multilayer formed of any one of metal materials such as molybdenum (Mo) and titanium (Ti) or an alloy thereof. However, this is exemplary, and the metal material included in the upper gate electrode GAT2_1 is not limited thereto.

Meanwhile, comparing the thin film transistor TR of FIG. 1 with the thin film transistor TR_1 of FIG. 2, a structure of the lower gate electrode GAT1 or GAT1_1 and/or a structure of the upper gate electrode GAT2 or GAT2_1 may be determined corresponding to a distance between the active layer ACT and the lower gate electrode GAT1 or GAT1_1 and a distance between the active layer ACT and the upper gate electrode GAT2 or GAT2_1. For example, when the distance between the active layer ACT and the upper gate electrode GAT2 or GAT2_1 is designed to be shorter than the distance between the active layer ACT and the lower gate electrode GAT1 or GAT1_1, the upper gate electrode GAT2 may have a stacked structure including a plurality of layers, as in the thin film transistor TR of FIG. 1, so as to facilitate forming of a depletion layer in the portion of the channel region CA of the active layer ACT. As another example, when the distance between the active layer ACT and the lower gate electrode GAT1 or GAT1_1 is designed to be shorter than the distance between the active layer ACT and the upper gate electrode GAT2 or GAT2_1, the lower gate electrode GAT1_1 may have a stacked structure including a plurality of layers, as in the thin film transistor TR_1 of FIG. 2, so as to facilitate forming of a depletion layer in the portion of the channel region CA of the active layer ACT. For example, when a thickness of the gate insulating layer GI between the active layer ACT and the upper gate electrode GAT2 or GAT2_1 is less than a thickness of the second buffer layer BUF2 between the active layer ACT and the lower gate electrode GAT1 or GAT1_1, the upper gate electrode GAT2 may have a stacked structure including a plurality of layers, as in the thin film transistor TR of FIG. 1; when the thickness of the second buffer layer BUF2 between the active layer ACT and the lower gate electrode GAT1 or GAT1_1 is less than the thickness of the gate insulating layer GI between the active layer ACT and the upper gate electrode GAT2 or GAT2_1, the lower gate electrode GAT1_1 may have a stacked structure including a plurality of layers, as in the thin film transistor TR_1 of FIG. 2. However, this is merely exemplary, and regardless of the distance between the active layer ACT and the lower gate electrode GAT1 or GAT1_1 and the distance between the active layer ACT and the upper gate electrode GAT2 or GAT2_1, the structures of the lower gate electrode GAT1 or GAT1_1 and the upper gate electrode GAT2 or GAT2_1 may be determined.

Figure 3:
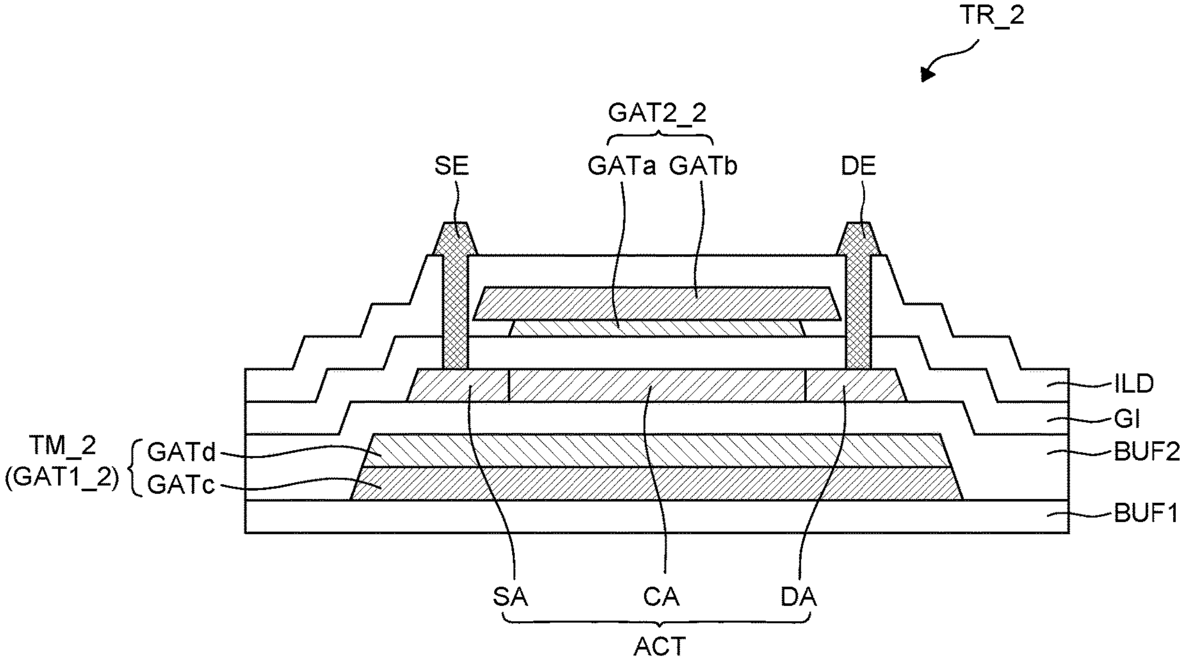
FIG. 3 is a cross-sectional view illustrating a thin film transistor according to exemplary embodiments of the present disclosure.

FIG. 3 is a cross-sectional view illustrating a thin film transistor according to exemplary embodiments of the present disclosure.

Meanwhile, in FIG. 3, a thin film transistor TR_2 of FIG. 3 represents a modified embodiment of the thin film transistor TR described with reference to FIG. 1 in relation to a structure of a gate electrode. For example, in the case of the thin film transistor TR_2 of FIG. 3, each of a lower gate electrode GAT1_2 which is a lower gate electrode and an upper gate electrode GAT2_2 which is an upper gate electrode may have a structure including a plurality of layers. Accordingly, to avoid descriptions overlapping with the contents described in FIG. 1, differences with the embodiment of FIG. 1 will be mainly described, and parts not specifically described follow the embodiment of FIG. 1. In addition, the same reference numerals indicate the same components, and similar reference numerals indicate similar components.

Referring to FIG. 3, the thin film transistor TR_2 according to exemplary embodiments of the present disclosure includes the plurality of buffer layers BUF1 and BUF2, the plurality of insulating layers GI and ILD, the active layer ACT, the lower gate electrode GAT1_2 (or a light blocking layer TM_2), the upper gate electrode GAT2_2, the source electrode SE, and the drain electrode DE.

The lower gate electrode GAT1_2 (or the light blocking layer TM_2) may be provided (or disposed) on the first buffer layer BUF1. The lower gate electrode GAT1_2 may be disposed to overlap at least a portion of the active layer ACT (e.g., the channel region CA of the active layer ACT).

In an exemplary embodiment, the lower gate electrode GAT1_2 may have a stacked structure including a plurality of layers. For example, the lower gate electrode GAT1_2 may include a structure in which a metal layer and a metal oxide layer are stacked. For example, the lower gate electrode GAT1_2 may have a structure in which the third sub-gate electrode GATc and the fourth sub-gate electrode GATd described with reference to FIG. 2 are stacked.

The upper gate electrode GAT2_2 may be provided (or disposed) on the gate insulating layer GI. The upper gate electrode GAT2_2 may be disposed to overlap at least a portion of the active layer ACT (e.g., the channel region CA of the active layer ACT).

In an exemplary embodiment, the upper gate electrode GAT2_2 may have a stacked structure including a plurality of layers. For example, the upper gate electrode GAT2_2 may include a structure in which a metal oxide layer and a metal layer are stacked. For example, the upper gate electrode GAT2_2 may have a structure in which the first sub-gate electrode GATa and the second sub-gate electrode GATb described with reference to FIG. 1 are stacked.

Accordingly, the thin film transistor TR_2 according to exemplary embodiments of the present disclosure includes gate electrodes (e.g., the lower gate electrode GAT1_2 and the upper gate electrode GAT2_2) including metal oxide layers (for example, the first sub-gate electrode GATa and the fourth sub-gate electrode GATd) having a relatively high work function value, without using a method such as a method of injecting excess oxygen into the gate insulating layer GI. Thus, a defect in which the margin of the effective channel length of the active layer ACT is reduced or element reliability is degraded is not caused, and it is possible to positively shift and set an initial threshold voltage to a predetermined level. Accordingly, element reliability of the thin film transistor TR_2 can be improved (or secured). In particular, in the case of the thin film transistor TR_2 of FIG. 3, since both upper and lower gate electrodes in the dual-gate structure include the metal oxide layer, reliability of the element can be further improved (or secured).

Also, as described with reference to FIG. 1, the thin film transistor TR_2 includes the upper gate electrode GAT2_2 including the sub-gate electrodes GATa and GATb having different widths, so that a channel length of the active layer ACT included in the thin film transistor TR_2 can be reduced (or minimized).

Figure 4:
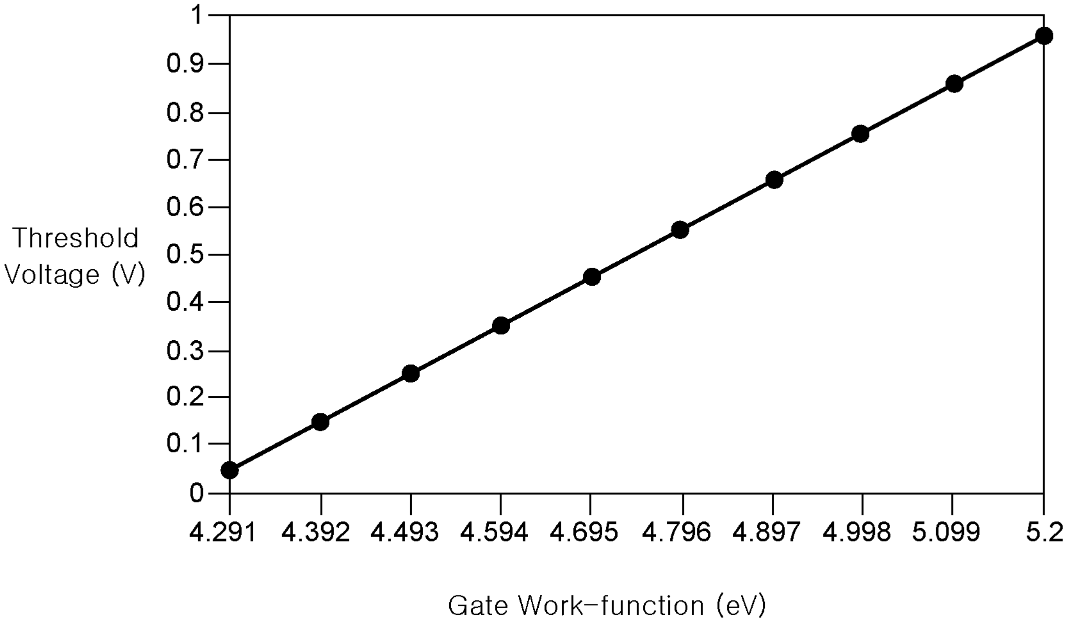
FIG. 4 is a graph for explaining threshold voltage values according to work functions.

FIG. 4 is a graph for explaining threshold voltage values according to work functions.

Meanwhile, FIG. 4 shows values of threshold voltages according to work functions of the gate electrode.

Referring to FIGS. 1 to 4, as shown in FIG. 4, the value of the threshold voltage may increase as the work function of the gate electrode increases. For example, as the work function of the gate electrode increases, the threshold voltage may have a tendency to have an increase in value thereof in a positive direction.

Here, as described with reference to FIGS. 1 to 3, at least one of the gate electrodes included in the thin film transistors TR, TR_1, and TR_2 includes a metal oxide layer having a relatively large work function (e.g., a molybdenum oxide (MoOx) layer), so that a defect in which the margin of the effective channel length of the active layer ACT is reduced or element reliability is degraded is not caused, and it is possible to positively shift and set an initial threshold voltage to a predetermined level. Accordingly, element reliability of the thin film transistors TR, TR_1, and TR_2 can be improved (or secured).

Figure 5A:
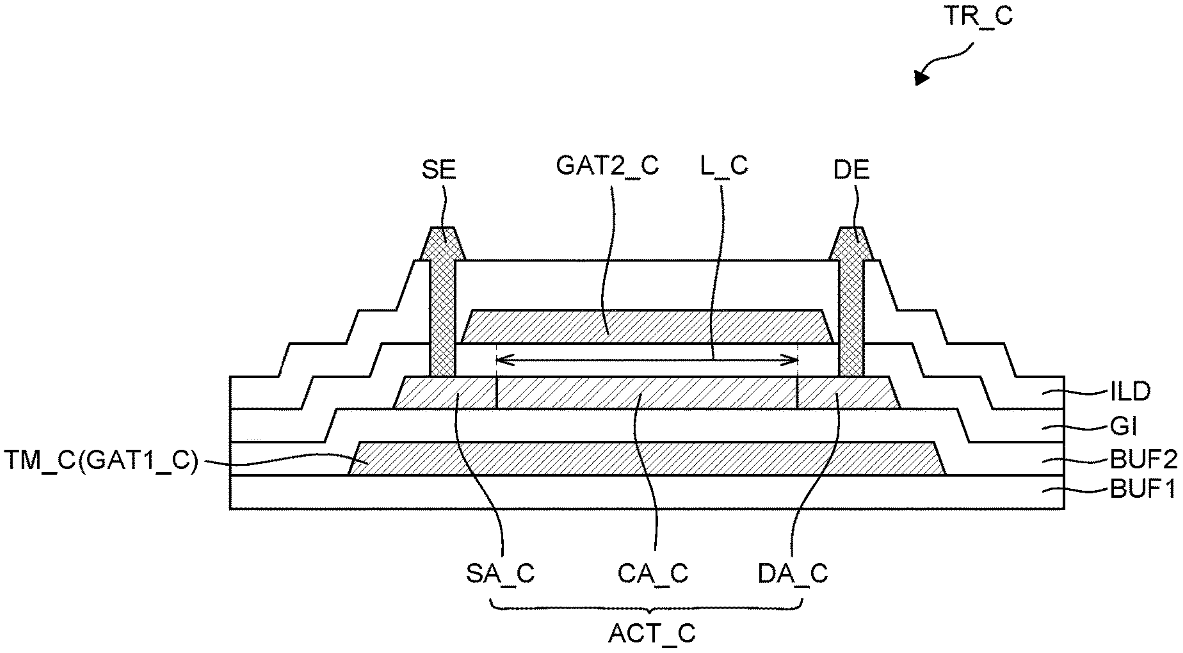
FIG. 5A is a view for explaining a channel length of an active layer included in a thin film transistor according to Comparative Example.

FIG. 5A is a view for explaining a channel length of an active layer included in a thin film transistor according to Comparative Example.

Figure 5B:
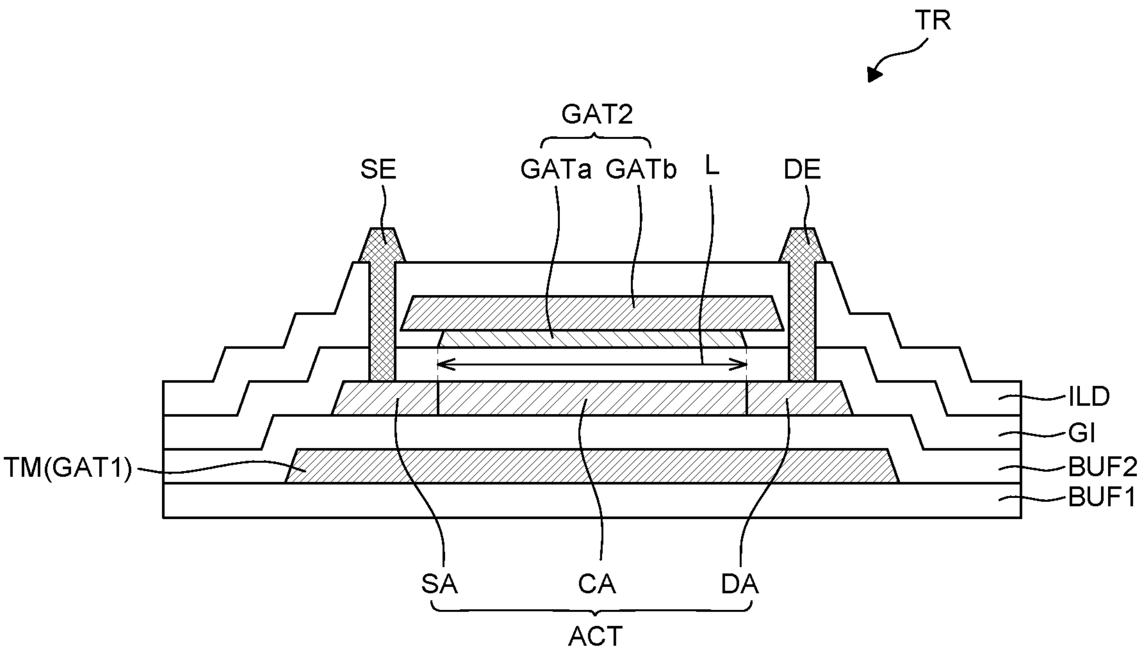
FIG. 5B is a view for explaining a channel length of an active layer included in a thin film transistor according to exemplary embodiments of the present disclosure.

FIG. 5B is a view for explaining a channel length of an active layer included in a thin film transistor according to exemplary embodiments of the present disclosure.

First, referring to FIG. 5A, a thin film transistor TR_C according to Comparative Example may include the plurality of buffer layers BUF1 and BUF2, the plurality of insulating layers GI and ILD, an active layer ACT_C, a first gate electrode GAT1_C (or a light blocking layer TM_C), a second gate electrode GAT2_C, the source electrode SE, and the drain electrode DE.

In a manufacturing process of the thin film transistor TR_C according to Comparative Example, during a doping process for conductorization of a source region SA_C and a drain region DA_C of the active layer ACT_C, doping is performed by applying impurities in a downward direction from above. Therefore, impurities may be added only to a region of the active layer ACT_C except for a region overlapping with the second gate electrode GAT2_C disposed above the active layer ACT_C. Accordingly, the region of the active layer ACT_C overlapping with the second gate electrode GAT2_C may be defined as an intrinsic channel region CA_C which is not doped with impurities. That is, the channel region CA_C of the active layer ACT_C has a relatively large channel length L_C that is equal to a width of the second gate electrode GAT2_C.

Next, referring to FIGS. 1 and 5B, the thin film transistor TR according to exemplary embodiments of the present disclosure may include the plurality of buffer layers BUF1 and BUF2, the plurality of insulating layers GI and ILD, the active layer ACT, the lower gate electrode GAT1 (or the light blocking layer TM), the upper gate electrode GAT2, the source electrode SE, and the drain electrode DE.

In the manufacturing process of the thin film transistor TR according to exemplary embodiments of the present disclosure, during a doping process for conductorization of the source region SA and the drain region DA of the active layer ACT, doping is performed by applying impurities in a downward direction from above. Here, the upper gate electrode GAT2 disposed above the active layer ACT has a structure in which the first sub-gate electrode GATa and the second sub-gate electrode GATb are stacked. Since the first sub-gate electrode GATa having a relatively small width is disposed under the second sub-gate electrode GATb having a relatively wide width, impurities may be added to a region of the active layer ACT excluding a region of the active layer overlapping with the first sub-gate electrode GATa. Accordingly, the region of the active layer ACT overlapping with the first sub-gate electrode GATa may be defined as an intrinsic channel region CA which is not doped with impurities. That is, the channel region CA of the active layer ACT may have a relatively small channel length L which is equal to the width of the first sub-gate electrode GATa. In this manner, in the case of the thin film transistor TR according to exemplary embodiments of the present disclosure, the channel length of the active layer ACT can be reduced (or minimized). However, the doping process is not limited to the above in the present disclosure.

Hereinafter, with further reference to FIGS. 6 to 9, display devices 1, 1_1, and 1_2 including the thin film transistors TR, TR_1, and TR_2 described with reference to FIGS. 1 to 5B will be described.

In the following embodiments, an organic light emitting display device will be mainly described as a display device. However, the embodiments of the present disclosure are not limited to the organic light emitting display device and the thin film transistors TR, TR_1, and TR_2 according to the embodiments of the present disclosure may be applied to various electroluminescent display devices. For example, the electroluminescent display device may be an organic light emitting diode (OLED) display device, a quantum-dot light emitting diode display device, or an inorganic light emitting diode display device, etc.

Figure 6:
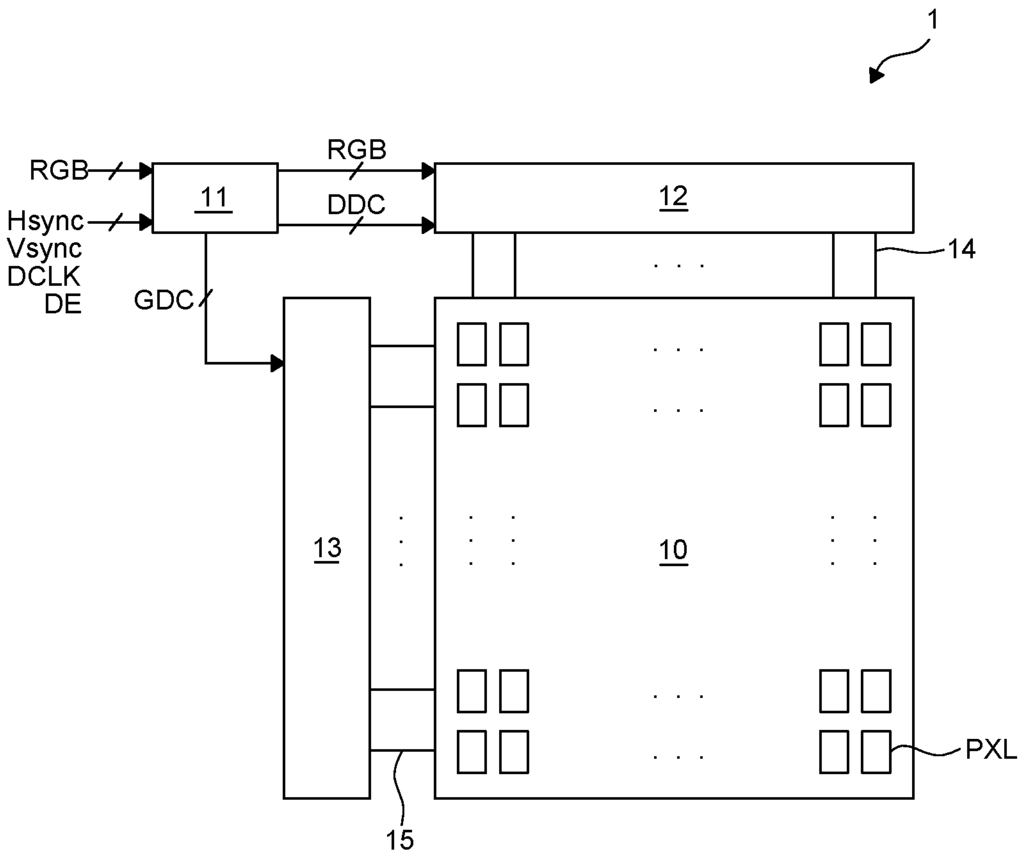
FIG. 6 is a block diagram illustrating a display device according to exemplary embodiments of the present disclosure.

FIG. 6 is a block diagram illustrating a display device according to exemplary embodiments of the present disclosure.

Referring to FIG. 6, the display device 1 according to the exemplary embodiments may include a display panel 10 on which pixels PXL are disposed, a data driving circuit 12 (or a data driver), a gate driving circuit 13 (or a gate driver), and a timing controller 11 that controls driving timings of the data driving circuit 12 and the gate driving circuit 13.

The display device 1 may be divided into a display area in which the pixels PXL are disposed to display an image and a non-display area outside the display area and in the vicinity of the display area or surrounding the display area.

A plurality of data lines 14 and a plurality of gate lines 15 may be disposed on the display panel 10. For example, on the display panel 10, the data lines 14 and the gate lines 15 may be disposed to cross each other.

Also, a plurality of the pixels PXL connected to the data lines 14 and/or the gate lines 15 may be disposed on the display panel 10. The pixels PXL may be arranged in a matrix form on the display panel 10, but this is merely exemplary, and the exemplary embodiments of the present disclosure are not limited thereto. Meanwhile, the pixels PXL disposed in the same pixel rows may be connected to corresponding gate lines 15 among the gate lines 15. Meanwhile, the gate lines 15 may include at least one scan line and at least one emission signal line.

For example, each pixel PXL may be connected to at least one data line 14, at least one scan line, and at least one emission signal line. Meanwhile, each of the pixels PXL may receive power supply voltages that are necessary for driving. For example, each of the pixels PXL may receive a high potential voltage, a low potential voltage, or an initialization voltage. For example, a high potential voltage, a low potential voltage, or an initialization voltage may have a predetermined voltage value. Meanwhile, the high potential voltage may have a voltage value higher than that of the low potential voltage.

Thin film transistors (TFTs) included in the pixels PXL may be implemented as oxide thin film transistors (or oxide TFTs) including oxide semiconductor layers. The oxide thin film transistor may be advantageous for an increase in area of the display panel 10 in consideration of both electron mobility and process variation. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO). However, embodiments of the present disclosure are not limited thereto, and the semiconductor layer of the thin film transistor may also be formed of a polycrystalline semiconductor material, or an amorphous semiconductor material.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si) (for example, low temperature poly silicon (LTPS)), but is not limited thereto.

The amorphous semiconductor material may be made of amorphous silicon (a-Si), but is not limited thereto.

Meanwhile, each of the pixels PXL may include at least three sub-pixels among white, red, green, and blue sub-pixels. For example, each of the pixels PXL may include a combination of red, green, and blue sub-pixels, a combination of white, red, and green sub-pixels, a combination of blue, white, and red sub-pixels, or a combination of green, blue, and white sub-pixels, or may include a combination of white, red, green, and blue sub-pixels, but the embodiments of the present disclosure are not limited thereto. For example, each of the pixels PXL may include red, green, and blue sub-pixels, in which the red, green, and blue sub-pixels may be disposed in a repeated manner. Alternatively, each of the pixels PXL may include red, green, blue, and white sub-pixels, in which the red, green, blue, and white sub-pixels may be disposed in a repeated manner, or the red, green, blue, and white sub-pixels may be disposed in a quad type. For example, the red sub pixel, the blue sub pixel, and the green sub pixel may be sequentially disposed along a row direction, or the red sub pixel, the blue sub pixel, and the green sub pixel and the white sub pixel may be sequentially disposed along the row direction. However, in the exemplary embodiment of the present disclosure, the color type, disposition type, and disposition order of the sub-pixels are not limiting, and may be configured in various forms according to light-emitting characteristics, device lifespans, and device specifications.

The sub-pixels may have different light-emitting areas according to light-emitting characteristics. For example, a sub-pixel that emits light of a color different from that of a blue sub-pixel may have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel may each has a different light-emitting area.

The timing controller 11 may rearrange digital video data RGB input from the outside according to a resolution of the display panel 10 and provide the rearranged digital video data RGB to the data driving circuit 12. In addition, the timing controller 11 may generate a data control signal DDC for controlling an operation timing of the data driving circuit 12 and a gate control signal GDC for controlling an operation timing of the gate driving circuit 13 based on timing signals such as a vertical synchronization signal Vsync, a horizontal synchronization signal Hsync, a dot clock signal DCLK, and a data enable signal DE.

The data driving circuit 12 may convert the digital video data RGB input from the timing controller 11 into an analog data voltage based on the data control signal DDC and supply the converted analog data voltage to the data lines 14.

The data circuit 12 may be implemented in the form of an integrated circuit (IC). For example, the data circuit 12 may be electrically connected to the pad electrode disposed in the non-display area through a flexible circuit film (not shown). Although the data circuit 12 is shown as being disposed on one side of the display panel 10 in FIG. 6, the number and position of the data circuit 12 are not limited thereto.

The gate driving circuit 13 may generate a gate signal based on the gate control signal GDC and supply it to the gate lines 15. For example, the gate driving circuit 13 may sequentially drive pixel rows in the display area by sequentially supplying a gate signal to the plurality of gate lines, here, the pixel row may refer to a row including pixels connected to one gate line. The gate driving circuit 13 may sequentially supply a gate signal with an On voltage or an Off voltage to the plurality of gate lines. The gate driving circuit 13 may be implemented in the form of an integrated circuit (IC), or may be implemented in a gate-in-panel (GIP) method in the display panel 10. Alternatively, the gate driving circuit 13 can be implemented by a chip-on-film COF method in which an element is mounted on a film connected to the display panel 10. Or the gate driving circuit 13 may also be disposed in the non-display area by a chip on panel (COP), a chip on glass (COG), a tape automated bonding (TAB), or a tape carrier package (TCP), but is not limited thereto.

Figure 7:
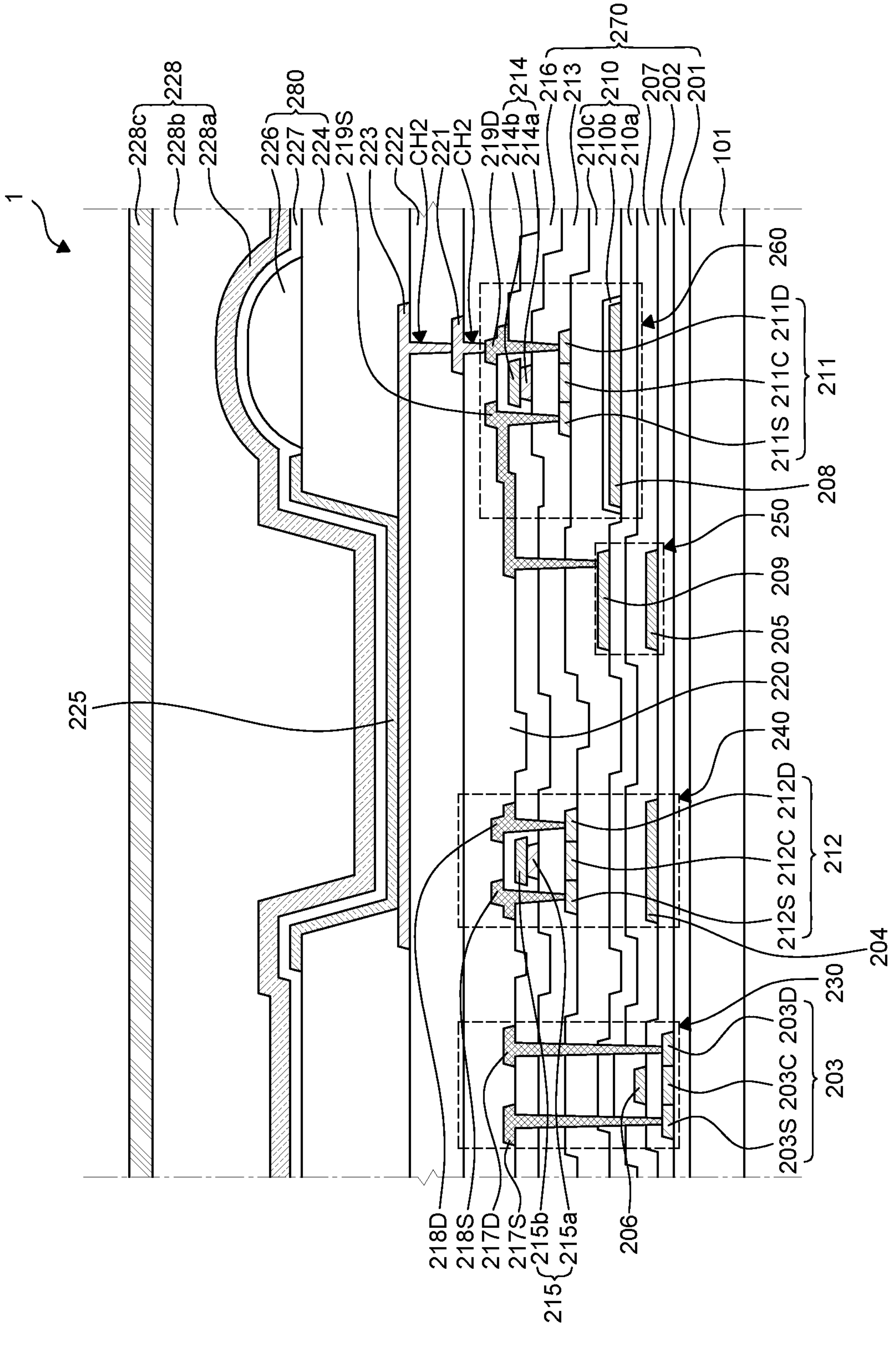
FIG. 7 is a cross-sectional view illustrating a display device according to exemplary embodiments of the present disclosure.

FIG. 7 is a cross-sectional view illustrating a display device according to exemplary embodiments of the present disclosure.

Meanwhile, FIG. 7 is a cross-sectional view illustrating an example of one driving transistor 260, a plurality of switching transistors 230 and 240, and one storage capacitor 250 among circuit components included in the pixel PXL described with reference to FIG. 6. The storage capacitor 250 is configured to maintain a certain current when emitting light. The storage capacitor is provided per pixel and occupies a certain area, whereby an aperture ratio is reduced. The aperture ratio has recently become an important issue in accordance with the trend of high resolution of the display device. A current density of the light emitting diode may be lowered by enhancing the aperture ratio, whereby lifespan of the light emitting diode may be increased. Since adaptability of the display device of high resolution is enhanced, it is required to implement an organic light emitting display device having a high aperture ratio.

Meanwhile, at least one of the transistors 230, 240, and 260 included in the display device 1 of FIG. 7 may be implemented as the thin film transistor TR described with reference to FIG. 1. Accordingly, to avoid descriptions overlapping with the aforementioned contents, differences will be mainly described.

Referring to FIGS. 1, 6, and 7, each of the pixels PXL may include a driving element unit 270 disposed on a substrate 101 and a light emitting element unit 280 electrically connected to the driving element unit 270. Meanwhile, the driving element unit 270 and the light emitting element unit 280 may be insulated by planarization layers 220 and 222.

The driving element unit 270 may be an array unit including the driving transistor 260, the switching transistors 230 and 240, and the storage capacitor 250 to drive one pixel PXL. The light emitting element unit 280 may be an array unit including a first electrode 223 as an anode electrode, a second electrode 227 as a cathode electrode, and an emission layer 225 disposed between the first electrode 223 and the second electrode 227 to emit light.

Meanwhile, as described above, FIG. 7 illustrates one driving transistor 260, two switching transistors 230 and 240, and one storage capacitor 250 as an example of the driving element unit 270.

In an exemplary embodiment, the driving transistor 260 and at least one switching transistor may include an oxide semiconductor layer as an active layer. The oxide semiconductor layer is a layer formed of an oxide semiconductor, has an excellent leakage current blocking effect, and is relatively inexpensive in manufacturing cost compared to a transistor using a polycrystalline semiconductor layer. For example, the oxide semiconductor layer may include IGZO, ZnO, $SnO_2$, $Cu_2O$, NiO, ITZO, and/or IAZO, and embodiments of the present disclosure are not limited thereto. In an exemplary embodiment of the present disclosure, the driving transistor 260 and at least one switching transistor may be implemented using the oxide semiconductor layer in order to reduce power consumption and manufacturing cost. For example, the driving transistor 260 and a second switching transistor 240 may include the oxide semiconductor layer as an active layer.

In an exemplary embodiment, at least one switching transistor may include a polycrystalline semiconductor layer as an active layer. The polycrystalline semiconductor layer is a layer formed of a polycrystalline semiconductor material, for example, polycrystalline silicon (poly-Si), and has a high operating speed and excellent reliability. For example, a first switching transistor 230 may include a polycrystalline semiconductor layer as an active layer.

However, this is merely exemplary, and the embodiments of the present disclosure are not limited thereto. For example, the driving transistor 260 and the switching transistors 230 and 240 may be implemented as thin film transistors TFT each including a different semiconductor layer. As another example, at least one of the driving transistor 260 and the switching transistors 230 and 240 may be implemented as a thin film transistor TFT including both a polycrystalline semiconductor layer and an oxide semiconductor layer. Hereinafter, as described above, descriptions are made based on an embodiment in which the driving transistor 260 and the second switching transistor 240 include an oxide semiconductor layer, and the first switching transistor 230 includes a polycrystalline semiconductor layer.

Depending on embodiments, at least one part of the driving transistor 260 and the two switching transistors 230 and 240 may be implemented as a p-type transistor and at least the other parts thereof may be implemented as n-type transistors. For example, among the driving transistor 260 and the two switching transistors 230 and 240, a thin film transistor TFT including a polycrystalline semiconductor layer may be a p-type transistor, and a thin film transistor TFT including an oxide semiconductor layer may be an n-type transistor.

The substrate 101 (e.g., a lower substrate and a base substrate) may have a multilayer structure in which at least one organic layer and at least one inorganic layer are alternately stacked. For example, the substrate 101 may be formed by alternately stacking an organic layer such as polyimide and an inorganic layer such as silicon oxide (SiOx). However, this is merely exemplary, and the embodiments of the present disclosure are not limited thereto. For example, the substrate 101 may include glass, plastic, or a flexible polymer film. For example, the flexible polymer film may be made of any one of polyimide (PI), polyethylene terephthalate (PET), acrylonitrile-butadiene-styrene copolymer(ABS), polymethyl methacrylate(PMMA), polyethylene naphthalate (PEN), polycarbonate (PC), polyethersulfone (PES), polyarylate (PAR), polysulfone (PSF), cyclic olefin copolymer(COC), triacetylcellulose(TAC), polyvinyl alcohol(PVA), and polystyrene(PS), and the present disclosure is not limited thereto.

A lower buffer layer 201 may be provided (or disposed) on the substrate 101. The lower buffer layer 201 may block materials that may permeate from the outside, for example, moisture.

The lower buffer layer 201 may include silicon oxide, silicon nitride, or silicon oxynitride. Depending on embodiments, the lower buffer layer 201 may be formed by using a silicon oxide layer, a silicon nitride layer, or a silicon oxynitride layer alone. Alternatively, the lower buffer layer 201 may have a stacked structure including a silicon oxide layer, a silicon nitride layer, or a silicon oxynitride layer. For example, the lower buffer layer 201 may be formed of an inorganic insulating film, and the inorganic insulating film may be provided as a single film or multiple films, respectively. For example, the inorganic insulating film in a single layer may be a silicon oxide (SiOx) film, a silicon nitride (SiNx) film or a silicon oxynitride (SiON) film, and inorganic insulating films in multiple layers may formed by alternately stacking two or more among one or more silicon oxide (SiOx) films, one or more silicon nitride (SiNx) films, and one or more silicon oxynitride (SiON) films, and one or more amorphous silicon (a-Si), but the present disclosure is not limited thereto. Depending on embodiments, a buffer layer for protecting the lower buffer layer 201 against moisture permeation may be further formed on the lower buffer layer 201.

The first switching transistor 230 may be provided (or disposed) on the substrate 101 (e.g., the lower buffer layer 201 disposed on the substrate 101). In an exemplary embodiment, the first switching transistor 230 may include a polycrystalline semiconductor layer as an active layer.

The first switching transistor 230 may include a channel through which electrons or holes move, and may include a first active layer 203 disposed on the lower buffer layer 201. Also, the first switching transistor 230 may include a first gate electrode 206, a first source electrode 217S, and a first drain electrode 217D.

In an exemplary embodiment, the first active layer 203 may include a polycrystalline semiconductor. The first active layer 203 may include a first channel region 203C and a first source region 203S and a first drain region 203D disposed with the first channel region 203C interposed therebetween.

Depending on embodiments, the first source region 203S and the first drain region 203D may include regions which are conductive by doping Group V or Group III impurity ions, for example, phosphorus (P) or boron (B), into intrinsic polycrystalline semiconductor patterns with a predetermined concentration. The first channel region 203C maintains an intrinsic state of the polycrystalline semiconductor and may provide a path for movement of electrons or holes.

A first gate insulating layer 202 may be provided (or disposed) on the first active layer 203. For example, the first gate insulating layer 202 may be disposed on the lower buffer layer 201 to cover the first active layer 203. Depending on embodiments, the first gate insulating layer 202 may include the same material as the lower buffer layer 201, but embodiments of the present disclosure are not limited thereto.

The first gate electrode 206 may be disposed on the first gate insulating layer 202. For example, the first gate electrode 206 may be disposed to overlap at least a portion of the first channel region 203C of the first active layer 203 on the first gate insulating layer 202.

Depending on embodiments, the first switching transistor 230 may be formed in a top gate structure in which the first gate electrode 206 is located above the first active layer 203, but embodiments of the present disclosure are not limited thereto. Meanwhile, in this case, a second light blocking layer 204 of the second switching transistor 240 and a first capacitor electrode 205 including the same material as that of the first gate electrode 206 may be formed through one mask process. Accordingly, the mask process can be simplified.

The first gate electrode 206 may include a metal. For example, the first gate electrode 206 may be a single layer or a multilayer formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

A first interlayer insulating layer 207 of the first switching transistor 230 may be provided (or disposed) on the first gate electrode 206. The first interlayer insulating layer 207 may include an insulating material such as silicon nitride (SiNx). Meanwhile, the first interlayer insulating layer 207 including silicon nitride (SiNx) may include hydrogen particles. When the first active layer 203 is formed, the first interlayer insulating layer 207 is deposited on the first active layer 203, and then a heat treatment process is performed thereon, the hydrogen particles included in the first interlayer insulating layer 207 may penetrate into the first source region 203S and the first drain region 203D and contribute to improvements and stabilization of conductivity of the polycrystalline semiconductor. This can be called a hydrogenation process.

Depending on embodiments, the first switching transistor 230 may further include an upper buffer layer 210, a second gate insulating layer 213, and a second interlayer insulating layer 216 that are sequentially disposed on the first interlayer insulating layer 207.

The upper buffer layer 210 may separate the first active layer 203 including a polycrystalline semiconductor from a second active layer 212 of the second switching transistor 240 and a third active layer 211 of the driving transistor 260 that include an oxide semiconductor layer. For example, the upper buffer layer 210 may provide a base on which the second active layer 212 and the third active layer 211 are formed.

The second interlayer insulating layer 216 may be disposed to cover a second gate electrode 215 of the second switching transistor 240 and a third gate electrode 214 of the driving transistor 260. Meanwhile, since the second interlayer insulating layer 216 is provided (or disposed) on the second active layer 212 and the third active layer 211 including an oxide semiconductor, it may be formed of an inorganic film that does not contain hydrogen particles.

The first source electrode 217S and the first drain electrode 217D of the first switching transistor 230 may be provided (or disposed) on the second interlayer insulating layer 216. The first source electrode 217S and the first drain electrode 217D may come into contact with and the first source region 203S and the first drain region 203D, respectively, through through-holes penetrating the second interlayer insulating layer 216, the second gate insulating layer 213, the upper buffer layer 210, the first interlayer insulating layer 207, and the first gate insulating layer 202.

The first source electrode 217S and the first drain electrode 217D of the first switching transistor 230 may be single layers or multiple layers formed of any one of molybdenum (Mo), aluminum (Al), chromium (Cr), gold (Au), titanium (Ti), nickel (Ni), neodymium (Nd) and copper (Cu) or an alloy of them, but the present disclosure is not limited thereto.

The second switching transistor 240 may be provided (or disposed) on the substrate 101. For example, the second switching transistor 240 may be provided (or disposed) on the lower buffer layer 201 and the first gate insulating layer 202. In an exemplary embodiment, the second switching transistor 240 may include an oxide semiconductor layer as an active layer.

The second switching transistor 240 includes a channel through which electrons or holes move, and may include the second active layer 212 disposed on the upper buffer layer 210. In addition, the second switching transistor 240 may include the second gate insulating layer 213 disposed on the second active layer 212 to cover the second active layer 212, the second gate electrode 215 disposed on the second gate insulating layer 213, the second interlayer insulating layer 216 disposed on the second gate electrode 215 to cover the second gate electrode 215, and a second source electrodes 218S and a second drain electrode 218D disposed on the second interlayer insulating layer 216.

In an exemplary embodiment, the second switching transistor 240 may further include the second light blocking layer 204 disposed below the upper buffer layer 210 and overlapping with at least a portion of the second active layer 212. Here, the second light blocking layer 204 may include the same material as the first gate electrode 206 and may be provided (or disposed) on the first gate insulating layer 202.

The second light blocking layer 204 and the second gate electrode 215 may constitute a dual-gate. That is, the second switching transistor 240 may have a dual-gate structure, and the second light blocking layer 204 may constitute a lower gate of the second switching transistor 240. For example, the second light blocking layer 204 may be substantially the same as or similar to the lower gate electrode GAT1 described with reference to FIG. 1. In this case, a flow of current flowing in a second channel region 212C of the second switching transistor 240 can be more precisely controlled, and the display device 1 can be manufactured in a reduced size, so that a display device of a high resolution can be implemented.

The second active layer 212 may include an oxide semiconductor. The second active layer 212 may include an intrinsic second channel region 212C that is not doped with impurities, and a second source region 212S and a second drain region 212D that are conductive by being doped with impurities.

The second gate insulating layer 213 may be provided (or disposed) on the second active layer 212. For example, the second gate insulating layer 213 may be disposed on the upper buffer layer 210 to cover the second active layer 212. Depending on embodiments, the second gate insulating layer 213 may include the same material as the lower buffer layer 201, but embodiments of the present disclosure are not limited thereto.

The second gate electrode 215 may be disposed on the second gate insulating layer 213. For example, the second gate electrode 215 may be disposed on the second gate insulating layer 213 to overlap at least a portion of the second channel region 212C of the second active layer 212, but embodiments of the present disclosure are not limited thereto.

In an exemplary embodiment, the second gate electrode 215 may include a 2-1 gate electrode 215*a* and a 2-2 gate electrode 215*b*. For example, the second gate electrode 215 of the second switching transistor 240 may have a stacked structure including a plurality of layers, in substantially the same manner as or similar to the upper gate electrode GAT2 described with reference to FIG. 1. For example, the second gate electrode 215 may include a structure in which a metal oxide layer and a metal layer are stacked. For example, the second gate electrode 215 may include a 2-1 gate electrode 215*a* and a 2-2 gate electrode 215*b* that are substantially the same as or similar to the first sub-gate electrode GATa and the second sub-gate electrode GATb described with reference to FIG. 1. In this case, the 2-1 gate electrode 215*a* may include a metal oxide (e.g., molybdenum oxide (MoOx)), and the 2-2 gate electrode 215*b* may include a metal (e.g., a metal material such as molybdenum (Mo) or titanium (Ti)).

In this manner, the second gate electrode 215 is configured to include the 2-1 gate electrode 215*a* and the 2-2 gate electrode 215*b*, so that element reliability of the second switching transistor element 240 can be improved (or secured), similarly to the description provided with reference to FIG. 1, and a channel length of the second active layer 212 can be minimized.

The second interlayer insulating layer 216 of the second switching transistor 240 may be provided (or disposed) on the second gate electrode 215.

The second source electrode 218S and the second drain electrode 218D of the second switching transistor 240 may be provided (or disposed) on the second interlayer insulating layer 216. The second source electrode 218S and the second drain electrode 218D may come into contact with the second source region 212S and the second drain region 212D, respectively through through-holes penetrating the second interlayer insulating layer 216 and the second gate insulating layer 213.

The second source electrode 218S and the second drain electrode 218D of the second switching transistor 240 may be single layers or multilayers formed of any one of molybdenum (Mo), aluminum (Al), chromium (Cr), gold (Au), titanium (Ti), nickel (Ni), neodymium (Nd) and copper (Cu) or an alloy of them, like the first source electrode 217S and the first drain electrode 217D. However, the present disclosure is not limited thereto.

Depending on embodiments, the second source electrode 218S and the second drain electrode 218D and the first source electrode 217S and the first drain electrode 217D may be formed of the same material on the second interlayer insulating layer 216 through the same process. In this case, a mask process can be simplified.

The driving transistor 260 may be provided (or disposed) on the substrate 101. For example, the driving transistor 260 may be provided (or disposed) on the upper buffer layer 210. In an exemplary embodiment, the driving transistor 260 may include an oxide semiconductor layer as an active layer.

The driving transistor 260 may include a channel through which electrons or holes move, and may include the third active layer 211 disposed on the upper buffer layer 210. In addition, the driving transistor 260 may include the second gate insulating layer 213 disposed on the third active layer 211 to cover the third active layer 211, the third gate electrode 214 disposed on the second gate insulating layer 213, the second interlayer insulating layer 216 disposed on the third gate electrode 214 to cover the third gate electrode 214, and a third source electrode 219S and a third drain electrode 219D disposed on the second interlayer insulating layer 216.

In an exemplary embodiment, the driving transistor 260 may further include a third light blocking layer 208 disposed within the upper buffer layer 210 and overlapping with at least a portion of the third active layer 211. The third light blocking layer 208 may be implemented in a form in which it is inserted into (or accommodated in) the upper buffer layer 210.

Describing a form in which the third light blocking layer 208 is disposed within the upper buffer layer 210 by reflecting process characteristics, the third light blocking layer 208 may be formed on a first upper sub-buffer layer 210*a* disposed on the first interlayer insulating layer 207. A second upper sub-buffer layer 210*b* completely covers the third light blocking layer 208 from an upper portion thereof, and a third upper sub-buffer layer 210*c* may be formed on the second upper sub-buffer layer 210*b*. For example, the upper buffer layer 210 may include a structure in which the first upper sub-buffer layer 210*a*, the second upper sub-buffer layer 210*b*, and the third upper sub-buffer layer 210*c* are sequentially stacked.

In an exemplary embodiment, the first upper sub-buffer layer 210*a* and the third upper sub-buffer layer 210*c* include silicon oxide (SiOx) that does not contain hydrogen particles and may serve as a base for the second switching transistor 240 and the driving transistor 260 using an oxide semiconductor layer of which reliability can be damaged by hydrogen particles, as an active layer.

The second upper sub-buffer layer 210*b* may include silicon nitride (SiNx) having an excellent ability to trap hydrogen particles. The second upper sub-buffer layer 210*b* may be provided (or disposed) to cover both an upper surface and side surfaces of the third light blocking layer 208 so as to completely seal the third light blocking layer 208.

Hydrogen particles generated during the hydrogenation process of the first switching transistor 230 using the polycrystalline semiconductor layer as an active layer pass through the upper buffer layer 210 and may damage the reliability of the oxide semiconductor layer disposed on the upper buffer layer 210. For example, when hydrogen particles infiltrate the oxide semiconductor layer, the transistor including the oxide semiconductor layer may have a different threshold voltage or a different conductivity of the channel depending on a location at which the oxide semiconductor layer is formed.

However, since silicon nitride (SiNx) included in the upper buffer layer 210 (e.g., the second upper sub-buffer layer 210*b*) is superior to silicon oxide (SiOx) in terms of trapping hydrogen particles, it is possible to prevent damage to reliability of the driving transistor 260, which is caused when the hydrogen particles permeate into the oxide semiconductor layer.

In an exemplary embodiment, the third light blocking layer 208 may be formed of a metal layer including a titanium (Ti) material having an excellent ability to trap hydrogen particles. For example, the third light blocking layer 208 may include a single layer of titanium, a double layer of molybdenum (Mo) and titanium (Ti), or an alloy of molybdenum (Mo) and titanium (Ti). However, the present disclosure is not limited thereto, and other metal layers including titanium (Ti) are also possible.

Here, titanium (Ti) may trap hydrogen particles diffusing in the upper buffer layer 210 and prevent the hydrogen particles from reaching the third active layer 211. In this case, the third light blocking layer 208 of the driving transistor 260 is formed of a metal layer having an ability to trap hydrogen particles, such as titanium (Ti). In addition, as the third light blocking layer 208 is covered by a silicon nitride (SiNx) layer having the ability to trap hydrogen particles, reliability of an oxide semiconductor pattern can be secured by the hydrogen particles.

Depending on embodiments, the second upper sub-buffer layer 210*b* containing silicon nitride (SiNx) is not deposited over an entire display area unlike the first upper sub-buffer layer 210*a*, and may be deposited only on a portion of an upper surface of the first upper sub-buffer layer 210*a* so as to selectively cover only the third light blocking layer 208. Since the second upper sub-buffer layer 210*b* is formed of a material different from that of the first upper sub-buffer layer 210*a*, for example, a silicon nitride (SiNx) film, film delamination may occur when it is deposited on an entire surface of the display area. To compensate for this, the second upper sub-buffer layer 210*b* may be selectively provided only at a location where the third light blocking layer 208 necessary in terms of functions is formed.

Depending on embodiments, the third light blocking layer 208 and the second upper sub-buffer layer 210*b* may be disposed vertically below the third active layer 211 so as to overlap with the third active layer 211 in terms of their functions. The third light blocking layer 208 and the second upper sub-buffer layer 210*b* may be formed larger than the third active layer 211 so as to completely overlap the third active layer 211.

The third light blocking layer 208 and the third gate electrode 214 may constitute a dual-gate. That is, the driving transistor 260 may have a dual-gate structure, and the third light blocking layer 208 may constitute a lower gate of the driving transistor 260. For example, the third light blocking layer 208 may be substantially the same as or similar to the lower gate electrode GAT1 described with reference to FIG. 1. In this case, a flow of current flowing through a third channel region 211C of the driving transistor 260 can be more precisely controlled, and the display device 1 can be manufactured in a reduced size, so that a display device of a high-resolution can be implemented.

The third active layer 211 may include an oxide semiconductor. The third active layer 211 may include an intrinsic third channel region 211C that is not doped with impurities, and a third source region 211S and a third drain region 211D that are conductive by being doped with impurities.

The second gate insulating layer 213 may be provided (or disposed) on the third active layer 211. For example, the second gate insulating layer 213 may be disposed on the upper buffer layer 210 to cover the third active layer 211.

The third gate electrode 214 may be disposed on the second gate insulating layer 213. For example, the third gate electrode 214 may be disposed on the second gate insulating layer 213 to overlap at least a portion of the third channel region 211C of the third active layer 211.

In an exemplary embodiment, the third gate electrode 214 may include a 3-1 gate electrode 214*a* and a 3-2 gate electrode 214*b*. For example, the third gate electrode 214 of the driving transistor 260 may have a stack structure including a plurality of layers, in substantially the same manner as or similar to the upper gate electrode GAT2 described with reference to FIG. 1. For example, the third gate electrode 214 may include a structure in which a metal oxide layer and a metal layer are stacked. For example, the third gate electrode 214 may include a 3-1 gate electrode 214*a* and a 3-2 gate electrode 214*b* that are substantially the same as or similar to the first sub-gate electrode GATa and the second sub-gate electrode GATb described with reference to FIG. 1. In this case, the 3-1 gate electrode 214*a* may include a metal oxide (e.g., molybdenum oxide (MoOx)), and the 3-2 gate electrode 214*b* may include a metal (e.g., a metal material such as molybdenum oxide (Mo) or titanium (Ti))

In this manner, the third gate electrode 214 is configured to include the 3-1 gate electrode 214*a* and the 3-2 gate electrode 214*b*, so that element reliability of the driving transistor 260 can be improved (or secured), similarly to the description provided with reference to FIG. 1, and a channel length of the third active layer 211 can be reduced or minimized.

The second interlayer insulating layer 216 of the driving transistor 260 may be provided (or disposed) on the third gate electrode 214.

The third source electrode 219S and the third drain electrode 219D of the driving transistor 260 may be provided (or disposed) on the second interlayer insulating layer 216. The third source electrode 219S and the third drain electrode 219D may come into contact with the third source region 211S and the third drain region 211D, respectively, through through-holes penetrating the second interlayer insulating layer 216 and the second gate insulating layer 213.

Similar to the first source electrode 217S and the first drain electrode 217D, the third source electrode 219S and the third drain electrode 219D of the driving transistor 260 may be single layers or multilayers formed of any one of molybdenum (Mo), aluminum (Al), or chromium (Cr), gold (Au), titanium (Ti), nickel (Ni), neodymium (Nd), and copper (Cu) or an alloy of them, but the present disclosure is not limited thereto.

Depending on embodiments, the third source electrode 219S and the third drain electrode 219D, and the first source electrode 217S, the first drain electrode 217D, the second source electrode 218S, and the second drain electrode 218D may be formed of the same material on the second interlayer insulating layer 216 through the same process. In this case, a mask process can be simplified.

The storage capacitor 250 is provided on the substrate 101 and may store a data voltage applied through the data line for a certain period of time and then provide the data voltage to the light emitting element. The storage capacitor 250 may include two electrodes corresponding to each other and a dielectric material disposed therebetween. The storage capacitor 250 may include the first capacitor electrode 205 formed of the same material and disposed on the same layer as the first gate electrode 206 and a second capacitor electrode 209 formed of the same material and disposed on the same layer as the third light blocking layer 208. The first interlayer insulating layer 207 and the first upper sub-buffer layer 210*a* may be disposed between the first capacitor electrode 205 and the second capacitor electrode 209. The second capacitor electrode 209 of the storage capacitor 250 may be electrically connected to the third source electrode 219S of the driving transistor 260.

Meanwhile, in FIG. 7, an example in which the storage capacitor 250 is separated from the driving transistor 260 and is provided on one side thereof is illustrated. However, the present disclosure is not limited thereto, and depending on embodiments, the storage capacitor 250 may be stacked with the driving transistor 260. In this case, at least a portion of the third source electrode 219S that is connected to the second capacitor electrode 209 may be omitted. For example, a fourth gate electrode may be further formed on the third gate electrode 214 of the driving transistor 260. In this case, the third gate electrode 214 and the fourth gate electrode may be spaced apart from each other at a predetermined interval, and based on this, the capacitor may be formed.

In an exemplary embodiment, a first planarization layer 220 and a second planarization layer 222 may be disposed on the driving element unit 270 to planarize an upper end of the driving element unit 270. The first planarization layer 220 and the second planarization layer 222 may be formed of an organic film such as polyimide or acrylic resin, but are not limited thereto.

The light emitting element unit 280 may be provided (or formed) on the second planarization layer 222. The light emitting element unit 280 may include the first electrode 223 as an anode electrode, the second electrode 227 as a cathode electrode corresponding to the first electrode 223, and the emission layer 225 interposed between the first electrode 223 and the second electrode 227. The first electrode 223 may be formed for each pixel.

In an exemplary embodiment, the light emitting element unit 280 may be connected to the driving element unit 270 through a connection electrode 221 formed on the first planarization layer 220. For example, the first electrode 223 of the light emitting element unit 280 and the third drain electrode 219D of the driving transistor 260 constituting the driving element unit 270 may be connected to each other by the connection electrode 221.

In an exemplary embodiment of the present disclosure, the first electrode 223 may be connected to the connection electrode 221 that is exposed through a contact hole CH1 penetrating the second planarization layer 222. In addition, the connection electrode 221 may be connected to the third drain electrode 219D that is exposed through a contact hole CH2 penetrating the first planarization layer 220.

The first electrode 223 may have a multilayer structure including a transparent conductive layer and an opaque conductive layer having high reflective efficiency. The transparent conductive layer may be formed of a material having a relatively large work function value such as indium-tin-oxide (ITO) or indium-zinc-oxide (IZO). The opaque conductive layer may be formed to have a single-layer or multilayer structure including Al, Ag, Cu, Pb, Mo, or Ti or an alloy thereof, but embodiments of the present disclosure are not limited thereto. For example, the first electrode 223 may be formed to have a structure in which the transparent conductive layer, the opaque conductive layer, and the transparent conductive layer are sequentially stacked, or a structure in which the transparent conductive layer and the opaque conductive layer are sequentially stacked. However, embodiments of the present disclosure are not limited thereto.

In an exemplary embodiment, the emission layer 225 may be formed by stacking a hole related layer, an organic emission layer, and an electron related layer on the first electrode 223 in the order or reverse order. For example, the emission layer 225 may include one or more of a hole injection layer (HIL), a hole transmitting layer (HTL), an electron transmitting layer (ETL) and an electron injection layer (EIL), and an organic emission layer, but the present disclosure is not limited thereto. A bank layer 224 may expose the first electrode 223 of each pixel. For example, the bank layer 224 may be a pixel defining layer defining each pixel. Depending on embodiments, the bank layer 224 may be formed of an opaque material, for example, a black material, to prevent or at least reduce light interference between adjacent pixels. In this case, the bank layer 224 may include a light blocking material formed of at least one of color pigments, organic black, and carbon. A spacer 226 may be disposed on the bank layer 224. The spacer 226 may ensure a gap between a fine metal mask (FMM) and the first electrode 223 so that the FMM is not in contact with the first electrode 223 in a deposition process of the emission layer 225.

In an exemplary embodiment, the second electrode 227, which is a cathode electrode, faces the first electrode 223 with the emission layer 225 interposed therebetween and may be formed on an upper surface and side surfaces of the emission layer 225. The second electrode 227 may be integrally formed on an entire surface of an active area. When applied to a top emission type organic light emitting display device, the second electrode 227 may be formed of a transparent conductive layer such as indium-tin-oxide (ITO) or indium-zinc-oxide (IZO). However, embodiments of the present disclosure are not limited thereto.

In an exemplary embodiment, an encapsulation unit 228 may be further disposed on the second electrode 227 to suppress moisture permeation. The encapsulation unit 228 may include a first inorganic encapsulation layer 228*a*, a second organic encapsulation layer 228*b*, and a third inorganic encapsulation layer 228*c* that are sequentially stacked.

The first inorganic encapsulation layer 228*a* and the third inorganic encapsulation layer 228*c* of the encapsulation unit 228 may be formed of an inorganic material such as silicon oxide (SiOx) or silicon nitride (SiNx). The second organic encapsulation layer 228*b* of the encapsulation unit 228 may be formed of an organic material such as acrylic resin, epoxy resin, phenolic resin, polyamide resin, and polyimide resin, but embodiments of the present disclosure are not limited thereto.

Meanwhile, the encapsulation unit 228 is not limited to three layers, for example, the encapsulation unit 228 may include n layers alternately stacked between inorganic encapsulation layer and organic encapsulation layer (where n is an integer greater than 3).

Figure 8:
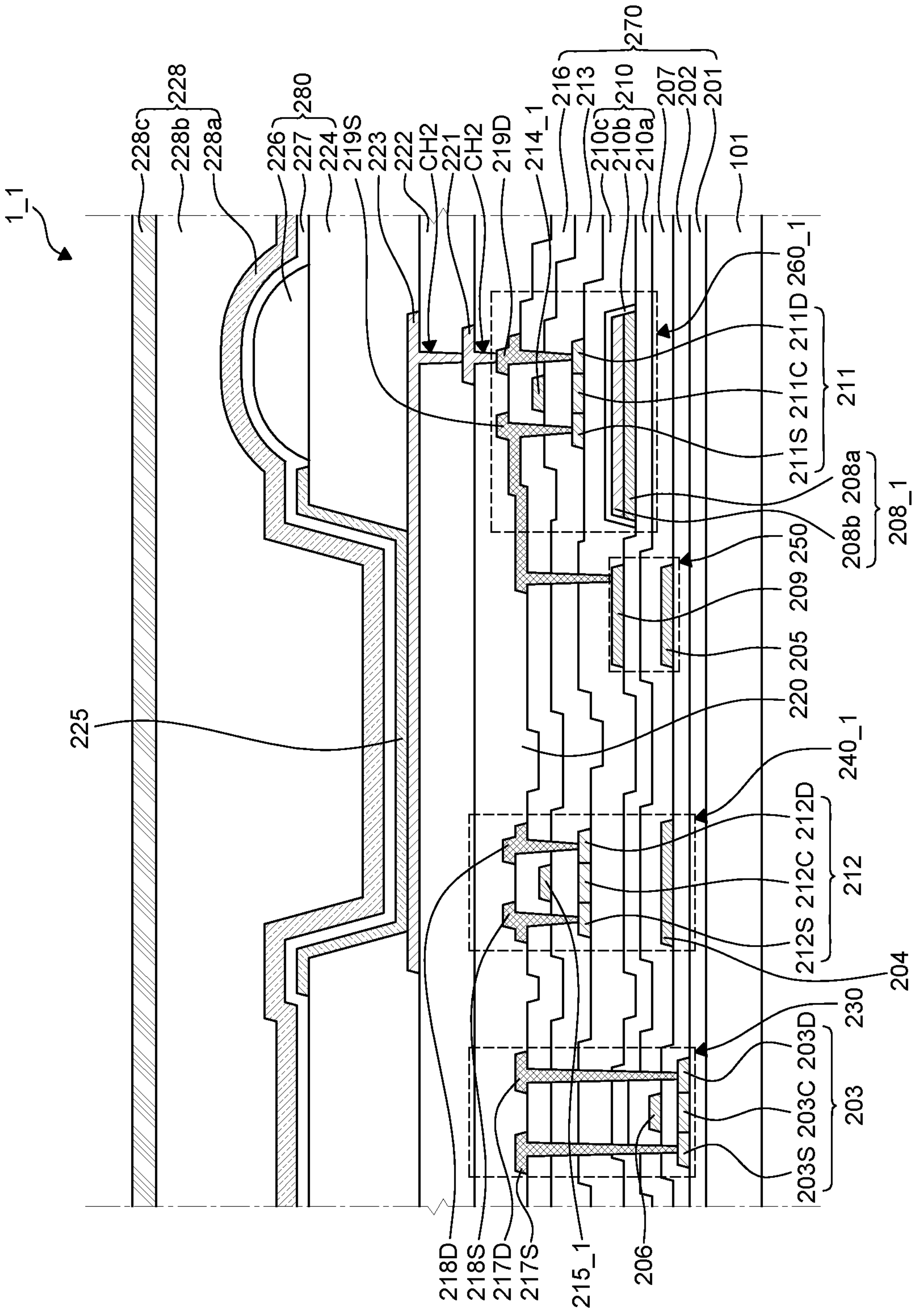
FIG. 8 is a cross-sectional view illustrating a display device according to exemplary embodiments of the present disclosure.

FIG. 8 is a cross-sectional view illustrating a display device according to exemplary embodiments of the present disclosure.

Meanwhile, in FIG. 8, the display device 1_1 of FIG. 8 represents a modified embodiment of the display device 1 described with reference to FIG. 7 in relation to structures of gate electrodes of a driving transistor 260_1 and a second switching transistor 240_1. Accordingly, to avoid descriptions overlapping with the contents described in FIG. 7, differences with the embodiment of FIG. 7 will be mainly described, and parts not specifically described follow the embodiments of FIG. 7. In addition, the same reference numerals indicate the same components, and similar reference numerals indicate similar components.

Meanwhile, FIG. 8 is a cross-sectional view illustrating an example of one driving transistor 260_1, two switching transistors 230 and 240_1, and one storage capacitor 250 among circuit components included in the pixel PXL described with reference to FIG. 6.

Meanwhile, at least one of the transistors 230, 240_1, and 260_1 included in the display device 1_1 of FIG. 8 may be implemented as the thin film transistor TR_1 described with reference to FIG. 2. To avoid descriptions overlapping with the aforementioned contents, differences will be mainly described.

Referring to FIGS. 2, 6, and 8, a second switching transistor 240_1 may be provided (or disposed) on the substrate 101. For example, the second switching transistor 240_1 may be provided (or disposed) on the lower buffer layer 201 and the first gate insulating layer 202. In an exemplary embodiment, the second switching transistor 240_1 may include an oxide semiconductor layer as an active layer.

The second switching transistor 240_1 may include the second light blocking layer 204 constituting a lower gate electrode, the second active layer 212, a second gate electrode 215_1 constituting an upper gate electrode, the second source electrode 218S and the second drain electrode 218D. However, embodiments of the present disclosure are not limited thereto.

The second gate electrode 215_1 may include a metal. For example, the second gate electrode 215_1 may include the same material as the upper gate electrode GAT2_1 described with reference to FIG. 2. For example, the second gate electrode 215_1 may include a metal material such as molybdenum (Mo) or titanium (Ti). Depending on embodiments, the second gate electrode 215_1 may be a single layer or a multilayer formed of any one of metal materials such as molybdenum (Mo) and titanium (Ti) or an alloy thereof. However, this is exemplary, and the metal included in the second gate electrode 215_1 is not limited thereto.

The driving transistor 260_1 may be provided (or disposed) on the substrate 101. In an exemplary embodiment, the driving transistor 260_1 may include an oxide semiconductor layer as an active layer.

The driving transistor 260_1 may include a third light blocking layer 208_1 constituting a lower gate electrode, the third active layer 211, a third gate electrode 214_1 constituting an upper gate electrode, the third source electrode 219S, and the third drain electrode 219D.

The third gate electrode 214_1 may include a metal. For example, the third gate electrode 214_1 may include the same material as the upper gate electrode GAT2_1 described with reference to FIG. 2. For example, the third gate electrode 214_1 may include a metal material such as molybdenum (Mo) or titanium (Ti). Depending on embodiments, the third gate electrode 214_1 may be a single layer or a multilayer formed of any one of metal materials such as molybdenum (Mo) and titanium (Ti) or an alloy thereof. However, this is exemplary, and the metal included in the third gate electrode 214_1 is not limited thereto.

In an exemplary embodiment, the third light blocking layer 208_1 constituting the lower gate electrode of the driving transistor 260_1 may include a 3-1 light blocking layer 208*a* and a 3-2 light blocking layer 208*b*. For example, the third light blocking layer 208_1 of the driving transistor 260_1 may have a stacked structure including a plurality of layers in substantially the same manner as or similar to the lower gate electrode GAT1_1 described with reference to FIG. 2. For example, the third light blocking layer 208_1 may include a structure in which a metal layer and a metal oxide layer are stacked. For example, the third light blocking layer 208_1 may include the 3-1 light blocking layer 208*a* and the 3-2 light blocking layer 208*b* that are substantially the same as or similar to the third sub-gate electrode GATc and the fourth sub-gate electrode GATd described with reference to FIG. 2. In this case, the 3-1 light blocking layer 208*a* may include a metal (e.g., a metal material such as molybdenum (Mo) or titanium (Ti)), and the 3-2 light blocking layer 208*b* may include a metal oxide (e.g., molybdenum oxide (MoOx)).

In this manner, the third light blocking layer 208_1 constituting the lower gate electrode of the driving transistor 260_1 is configured to include the 3-1 light blocking layer 208*a* and the 3-2 light blocking layer 208*b*, so that element reliability of the driving transistor 260_1 can be improved (or secured), similarly to the description provided with reference to FIG. 2.

Meanwhile, FIG. 2 illustrates that the second light blocking layer 204 constituting the lower gate electrode of the second switching transistor 240_1, similar to the driving transistor 260_1, does not have a stacked structure including a plurality of layers. This is because a plurality of insulating layers (e.g., the first interlayer insulating layer 207 and the upper buffer layer 210) are disposed between the second light blocking layer 204 constituting the lower gate electrode of the second switching transistor 240_1 and the second active layer 212, so a distance between the second light blocking layer 204 and the second active layer 212 is relatively large, and accordingly, it is difficult to form a depletion layer in a portion of the second channel region 212C of the second active layer 212. However, this is merely exemplary, and embodiments of the present disclosure are not limited thereto. For example, the second light blocking layer 204 constituting the lower gate electrode of the second switching transistor 240_1, similar to the driving transistor 260_1, may have a stacked structure including a plurality of layers.

Figure 9:
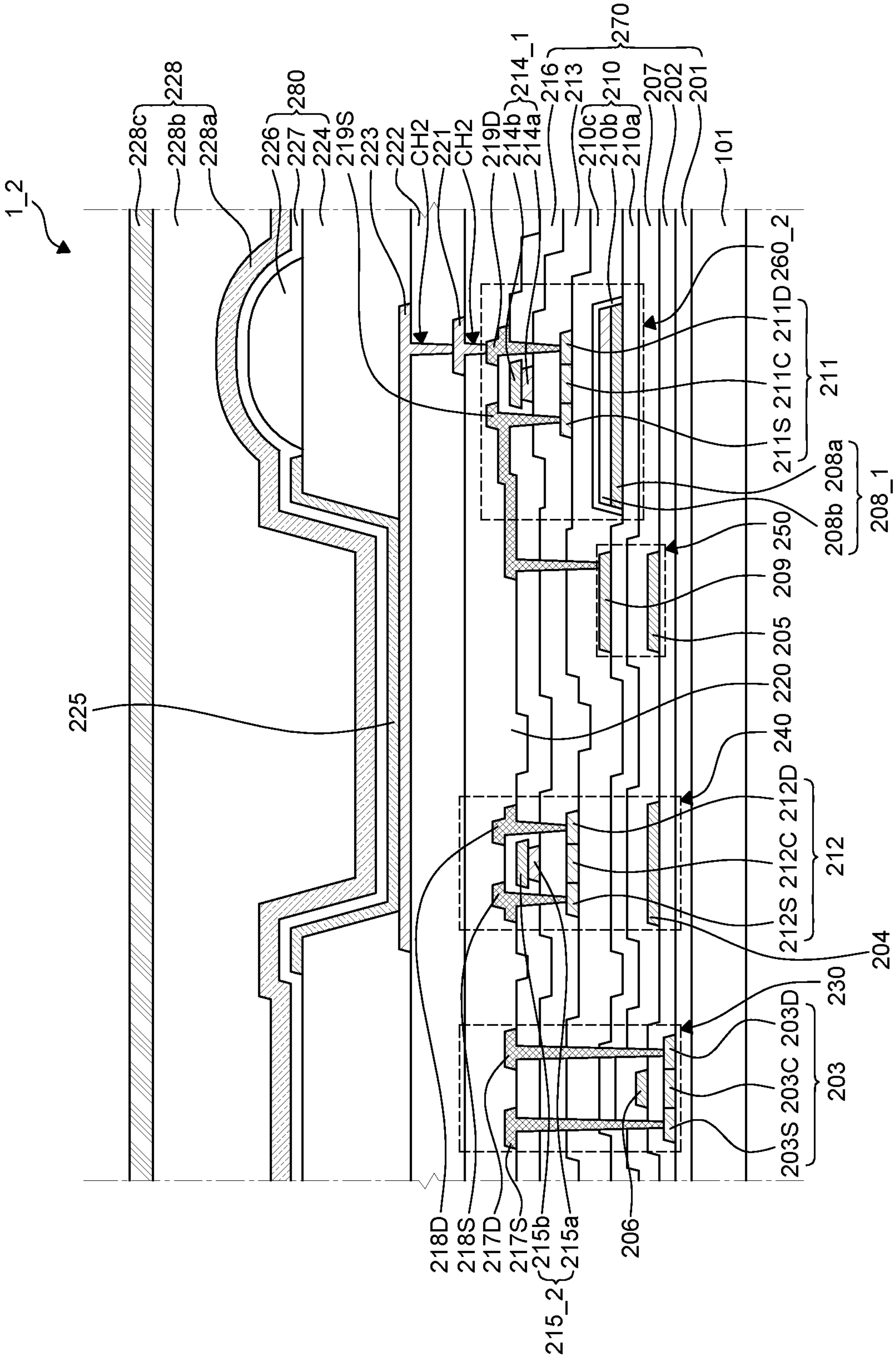
FIG. 9 is a cross-sectional view illustrating a display device according to exemplary embodiments of the present disclosure.

FIG. 9 is a cross-sectional view illustrating a display device according to exemplary embodiments of the present disclosure.

Meanwhile, in FIG. 9, the display device 1_2 of FIG. 9 represents a modified embodiment of the display device 1 described with reference to FIG. 7 in relation to a structure of a gate electrode of a driving transistor 260_2. Accordingly, to avoid descriptions overlapping with the contents described in FIG. 7, differences with the embodiments of FIG. 7 will be mainly described, and parts not specifically described follow the embodiments of FIG. 7. In addition, the same reference numerals indicate the same components, and similar reference numerals indicate similar components.

Meanwhile, FIG. 9 is a cross-sectional view illustrating an example of one driving transistor 260_2, two switching transistors 230 and 240, and one storage capacitor 250 among circuit components included in the pixel PXL described with reference to FIG. 6.

Meanwhile, at least one of the transistors 230, 240, and 260_2 included in the display device 1_2 of FIG. 9 may be implemented as the thin film transistor TR_2 described with reference to FIG. 3. To avoid descriptions overlapping with the aforementioned contents, differences will be mainly described, Referring to FIGS. 3, 6, and 9, the driving transistor 260_2 may be provided (or disposed) on the substrate 101. In an exemplary embodiment, the driving transistor 260_2 may include an oxide semiconductor layer as an active layer.

The driving transistor 260_2 may include the third light blocking layer 208_1 constituting a lower gate electrode, the third active layer 211, the third gate electrode 214 constituting an upper gate electrode, the third source electrode 219S, and the third drain electrode 219D. However, embodiments of the present disclosure are not limited thereto.

In an exemplary embodiment, the third light blocking layer 208_1 constituting the lower gate electrode of the driving transistor 260_2 may include the 3-1 light blocking layer 208*a* and the 3-2 light blocking layer 208*b*. For example, the third light blocking layer 208_1 of the driving transistor 260_2 may have a stacked structure including a plurality of layers in substantially the same manner as or similar to the lower gate electrode GAT1_2 described with reference to FIG. 3. For example, the third light blocking layer 208_1 may include a structure in which a metal layer and a metal oxide layer are stacked. For example, the third light blocking layer 208_1 may include the 3-1 light blocking layer 208*a* and the 3-2 light blocking layer 208*b* that are substantially the same as or similar to the third sub-gate electrode GATc and the fourth sub-gate electrode GATd described with reference to FIG. 3. In this case, the 3-1 light blocking layer 208*a* may include a metal (e.g., a metal material such as molybdenum (Mo) or titanium (Ti)), and the 3-2 light blocking layer 208*b* may include a metal oxide (e.g., molybdenum oxide (MoOx)).

In this manner, the third gate electrode 214 constituting the upper gate electrode of the driving transistor 260_2 is configured to include a plurality of layers (e.g., the 3-1 gate electrode 214*a* and the 3-2 gate electrode 214*b*), and the third light blocking layer 208_1 constituting the lower gate electrode of the driving transistor 260_2 is configured to include the 3-1 light blocking layer 208*a* and the 3-2 light blocking layer 208*b* that are a plurality of layers. Thus, element reliability of the driving transistor 260_2 can be improved (or secured) and the channel length of the third active layer 211 can be reduced or minimized, similarly to the description provided with reference to FIG. 3.

As described above, in the thin film transistors and the display device including the thin film transistors according to exemplary embodiments of the present disclosure, the upper gate electrode and/or the lower gate electrode included in the thin film transistor may include a plurality of layers having different work function values. Here, among the plurality of layers included in the upper gate electrode and/or the lower gate electrode of the thin film transistor, a layer (or sub-gate electrode) adjacent to the active layer may include a metal oxide having a relatively high work function. Accordingly, a depletion layer may be more easily formed in a channel region portion of the active layer, and thus, a threshold voltage of the thin film transistor can be shifted in a positive direction. Therefore, in the case of the thin film transistors and the display device including the thin film transistors according to exemplary embodiments of the present disclosure, a defect in which a margin of an effective channel length of the active layer is reduced or element reliability is degraded, is not caused and it is possible to positively shift and set an initial threshold voltage to a predetermined level. Accordingly, element reliability of the thin film transistor can be improved (or secured).

In addition, in the thin film transistors and the display device including the thin film transistors according to exemplary embodiments of the present disclosure, according to a difference in etching rate of the plurality of layers included in the upper gate electrode of the thin film transistor, a lower layer (or sub-gate electrode) among the plurality of layers has a relatively small width in an etching process. Thus, when a doping process is performed for conductorization of the source region and the drain region of the active layer, a channel region having a relatively small length may be formed. Accordingly, the channel length of the active layer included in the thin film transistor can be minimized.

The exemplary embodiments of the present disclosure can also be described as follows:

According to an aspect of the present disclosure, a thin film transistor includes a first buffer layer; a lower gate electrode on the first buffer layer; a second buffer layer on the lower gate electrode; an active layer on the second buffer layer and including a source region, a drain region, and a channel region between the source region and the drain region; a gate insulating layer on the active layer; an upper gate electrode on the gate insulating layer. At least one of the upper gate electrode and the lower gate electrode includes a plurality of layers, and a work function of a layer adjacent to the active layer is greater than a work function of a layer far from the active layer, among the plurality of layers.

The thin film transistor may further an interlayer insulating layer on the upper gate electrode; and a source electrode and a drain electrode on the interlayer insulating layer and in contact with the source region and the drain region respectively through through-holes penetrating the interlayer insulating layer and the gate insulating layer.

The upper gate electrode may include a first sub-gate electrode on the gate insulating layer; and a second sub-gate electrode on the first sub-gate electrode.

The first sub-gate electrode may include a metal oxide, and the second sub-gate electrode may include a metal.

The first sub-gate electrode may include molybdenum oxide (MoOx), and the second sub-gate electrode may include at least one of molybdenum (Mo) and titanium (Ti).

A width of the second sub-gate electrode may be greater than a width of the first sub-gate electrode.

A width of the channel region may correspond to a width of the first sub-gate electrode.

A distance between the upper gate electrode and the active layer may be smaller than a distance between the lower gate electrode and the active layer.

The lower gate electrode may include a third sub-gate electrode on the first buffer layer; and a fourth sub-gate electrode on the third sub-gate electrode.

The third sub-gate electrode may include a metal, and the fourth sub-gate electrode may include a metal oxide.

The third sub-gate electrode may include at least one of molybdenum (Mo) and titanium (Ti), and the fourth sub-gate electrode may include molybdenum oxide (MoOx).

A distance between the lower gate electrode and the active layer may be smaller than a distance between the upper gate electrode and the active layer.

According to the thin film transistor of the present disclosure, the upper gate electrode may include a first sub-gate electrode on the gate insulating layer; and a second sub-gate electrode on the first sub-gate electrode, and the lower gate electrode may includes a third sub-gate electrode on the first buffer layer; and a fourth sub-gate electrode on the third sub-gate electrode.

Each of the first sub-gate electrode and fourth sub-gate electrode may include a metal oxide, and each of the second sub-gate electrode and the third sub-gate electrode may include a metal.

Each of the first sub-gate electrode and fourth sub-gate electrode may include molybdenum oxide (MoOx), and each of the second sub-gate electrode and the third sub-gate electrode may include at least one of molybdenum (Mo) and titanium (Ti).

The width of the second sub-gate electrode may be greater than a width of the first sub-gate electrode.

The width of the channel region may correspond to a width of the first sub-gate electrode.

The active layer may include an oxide semiconductor.

According to another aspect of the present disclosure, a display device includes a substrate; and pixels including at least one thin film transistor on the substrate. The at least one thin film transistor includes a first buffer layer; a lower gate electrode on the first buffer layer; a second buffer layer on the lower gate electrode; an active layer on the second buffer layer and including a source region, a drain region, and a channel region between the source region and the drain region; a gate insulating layer on the active layer; an upper gate electrode on the gate insulating layer; an interlayer insulating layer on the upper gate electrode; and a source electrode and a drain electrode on the interlayer insulating layer and in contact with the source region and the drain region respectively through through-holes penetrating the interlayer insulating layer and the gate insulating layer. At least one of the upper gate electrode and the lower gate electrode includes a plurality of layers, and a work function of a layer adjacent to the active layer is greater than a work function of a layer far from the active layer, among the plurality of layers.

The upper gate electrode may include a first sub-gate electrode on the gate insulating layer; and a second sub-gate electrode on the first sub-gate electrode.

The first sub-gate electrode may include a metal oxide, and the second sub-gate electrode may include a metal.

A width of the second sub-gate electrode may be greater than a width of the first sub-gate electrode.

The lower gate electrode may include a third sub-gate electrode on the first buffer layer; and a fourth sub-gate electrode on the third sub-gate electrode.

The third sub-gate electrode may include a metal, and the fourth sub-gate electrode may include a metal oxide.

The active layer may include an oxide semiconductor.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A thin film transistor, comprising:

a first buffer layer;

a lower gate electrode on the first buffer layer, the lower gate electrode including a third sub-gate electrode on the first buffer layer and a fourth sub-gate electrode on the third sub-gate electrode;

a second buffer layer on the lower gate electrode;

an active layer on the second buffer layer, the active layer including a source region, a drain region, and a channel region between the source region and the drain region;

a gate insulating layer on the active layer; and an upper gate electrode on the gate insulating layer, the upper gate electrode including a first sub-gate electrode on the gate insulating layer and a second sub-gate electrode on the first sub-gate electrode, wherein a work function of a layer of each of the upper gate electrode and the lower gate electrode that is adjacent to the active layer is greater than a work function of a layer of each of the upper gate electrode and the lower gate electrode that is farther from the active layer, and wherein each of the first sub-gate electrode and the fourth sub-gate electrode includes a metal oxide, and each of the second sub-gate electrode and the third sub-gate electrode includes a metal.

2. The thin film transistor of claim 1, further comprising:

an interlayer insulating layer on the upper gate electrode; and a source electrode and a drain electrode on the interlayer insulating layer and in contact with the source region and the drain region respectively through through-holes penetrating the interlayer insulating layer and the gate insulating layer.

3. The thin film transistor of claim 1, wherein the first sub-gate electrode includes molybdenum oxide, and the second sub-gate electrode includes at least one of molybdenum and titanium.

4. The thin film transistor of claim 1, wherein a distance between the upper gate electrode and the active layer is less than a distance between the lower gate electrode and the active layer.

5. The thin film transistor of claim 1, wherein the third sub-gate electrode includes at least one of molybdenum and titanium, and the fourth sub-gate electrode includes molybdenum oxide.

6. The thin film transistor of claim 1, wherein a distance between the lower gate electrode and the active layer is less than a distance between the upper gate electrode and the active layer.

7. The thin film transistor of claim 1, wherein each of the first sub-gate electrode and fourth sub-gate electrode includes molybdenum oxide, and each of the second sub-gate electrode and the third sub-gate electrode includes at least one of molybdenum and titanium.

8. The thin film transistor of claim 1, wherein a width of the second sub-gate electrode is greater than a width of the first sub-gate electrode.

9. The thin film transistor of claim 8, wherein a width of the channel region corresponds to a width of the first sub-gate electrode.

10. The thin film transistor of claim 1, wherein the active layer includes an oxide semiconductor.

11. A display device, comprising:

a substrate; and pixels including at least one thin film transistor according to claim 1 on the substrate.

12. The display device of claim 11, wherein the at least one thin film transistor includes at least one switch thin film transistor and at least one driving thin film transistor.

* * * * *